United States Patent [19]

Galbi

[11] Patent Number: 5,890,124
[45] Date of Patent: Mar. 30, 1999

[54] WINDOWING METHOD FOR DECODING OF MPEG AUDIO DATA

[75] Inventor: David E. Galbi, Sunnyvale, Calif.

[73] Assignee: C-Cube Microsystems Inc., Milpitas, Calif.

[21] Appl. No.: 548,889

[22] Filed: Oct. 26, 1995

Related U.S. Application Data

[60] Division of Ser. No. 311,659, Sep. 23, 1994, Pat. No. 5,649,029, which is a continuation-in-part of Ser. No. 288,652, Aug. 10, 1994, abandoned, which is a continuation of Ser. No. 890,732, May 28, 1992, abandoned, which is a continuation-in-part of Ser. No. 669,818, Mar. 15, 1991, abandoned.

[51] Int. Cl.$^6$ ........................................................ G10L 3/00
[52] U.S. Cl. ............................................................ 704/501
[58] Field of Search .................................. 395/2.09, 2.94, 395/2.91, 2.12; 382/232, 233, 234, 250; 704/500, 501, 502, 503, 504

[56] References Cited

U.S. PATENT DOCUMENTS

| | | | |
|---|---|---|---|
| 3,688,039 | 8/1972 | Ishiguro | 371/31 |
| 4,302,775 | 11/1981 | Widegren et al. | 358/136 |
| 4,394,774 | 7/1983 | Widergren et al. | 382/56 |
| 4,688,186 | 8/1987 | Ferrell et al. | 364/764 |
| 4,831,440 | 5/1989 | Borgers et al. | 358/133 |
| 4,989,173 | 1/1991 | Kaneda | 364/764 |
| 5,021,891 | 6/1991 | Lee | 358/432 |
| 5,070,503 | 12/1991 | Shikakura | 371/37.1 |
| 5,140,544 | 8/1992 | Lin et al. | 364/761 |
| 5,414,469 | 5/1995 | Gonzales et al. | 348/408 |
| 5,436,917 | 7/1995 | Karasawa | 371/37.4 |
| 5,452,104 | 9/1995 | Lee | 358/433 |
| 5,508,949 | 4/1996 | Konstantinides | 364/725 |
| 5,644,310 | 7/1997 | Laczko, Sr.et al. | 341/143 |

OTHER PUBLICATIONS

1992 IEEE International Conference on Consumer Electronics; Maturi, "Single chip MPEG audio decoder". vol. 38 pp. 348–356, Aug. 1992.

*Primary Examiner*—Richemond Dorvil
*Attorney, Agent, or Firm*—Skjerven, Morrill, MacPherson, Franklin & Friel; David T. Millers

[57] ABSTRACT

An MPEG audio/video decoder has memories, a signal processing unit (SPU) including a multiplier and a butterfly unit, a main CPU, and a memory controller which are time division multiplexed between decoding video and audio data. For audio decoding, the butterfly unit determines combinations of components of a frequency-domain vector to reduce the number of multiplies required to transform to the time domain (matrixing). Matrixing is interwoven with MPEG filtering to increase throughput of the decoder by increasing parallel use of the multiplier, the butterfly unit, and a memory controller. A widowing process for the MPEG standard uses only independent components of the audio vectors. This reduces the required number of components to be stored, thereby reducing the size of required memory, the time to write the components after matrixing, and the time to retrieve the components for windowing.

4 Claims, 13 Drawing Sheets

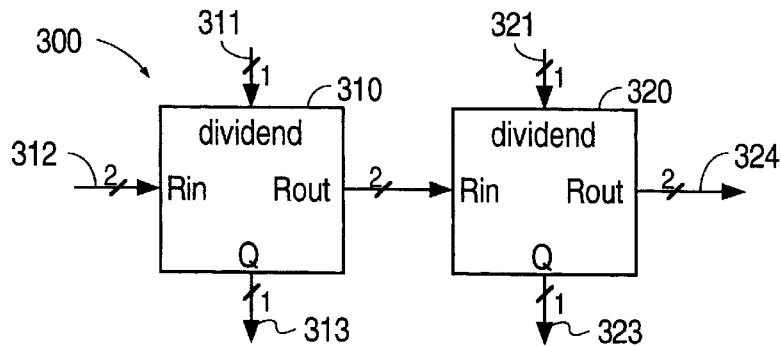
FIG. 3A
FIG. 3B
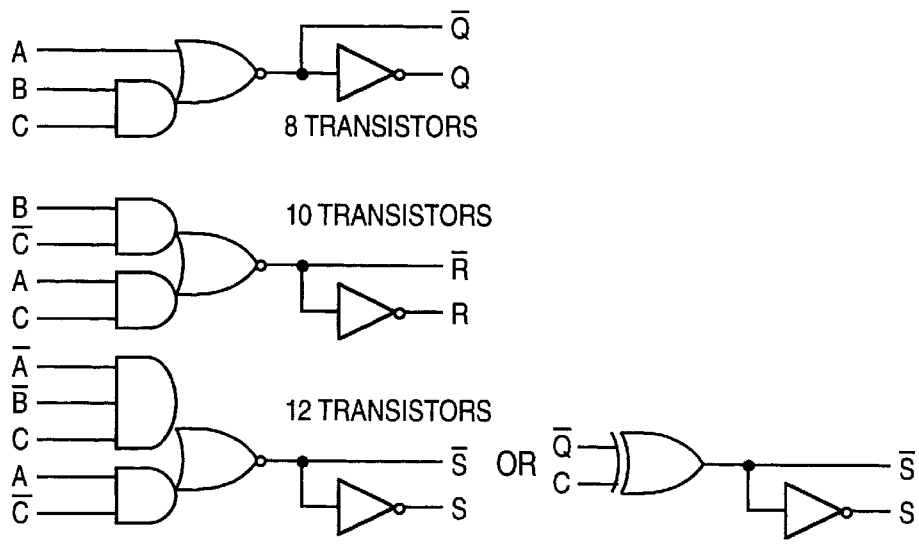
FIG. 3C

| Rin | | | quotiant | Rout | | |
|---|---|---|---|---|---|---|
| dividend | | | | remainder | | |
| A | B | C | Din | Q | R | S | T |
| 0 | 0 | 0 | 0 | 0 | 0 | 0 | 0 |
| 0 | 0 | 0 | 1 | 0 | 0 | 0 | 1 |
| 0 | 0 | 1 | 0 | 0 | 0 | 1 | 0 |
| 0 | 0 | 1 | 1 | 0 | 0 | 1 | 1 |
| 0 | 1 | 0 | 0 | 0 | 1 | 0 | 0 |
| 0 | 1 | 0 | 1 | 1 | 0 | 0 | 0 |
| 0 | 1 | 1 | 0 | 1 | 0 | 0 | 1 |
| 0 | 1 | 1 | 1 | 1 | 0 | 1 | 0 |
| 1 | 0 | 0 | 0 | 1 | 0 | 1 | 1 |
| 1 | 0 | 0 | 1 | 1 | 1 | 0 | 0 |

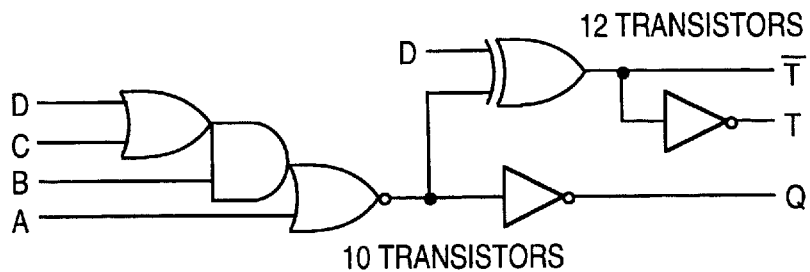
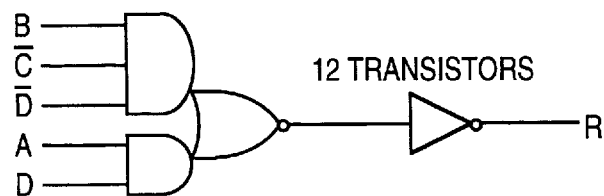
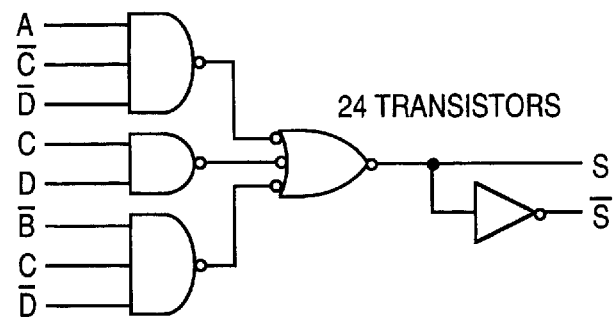
FIG. 4C

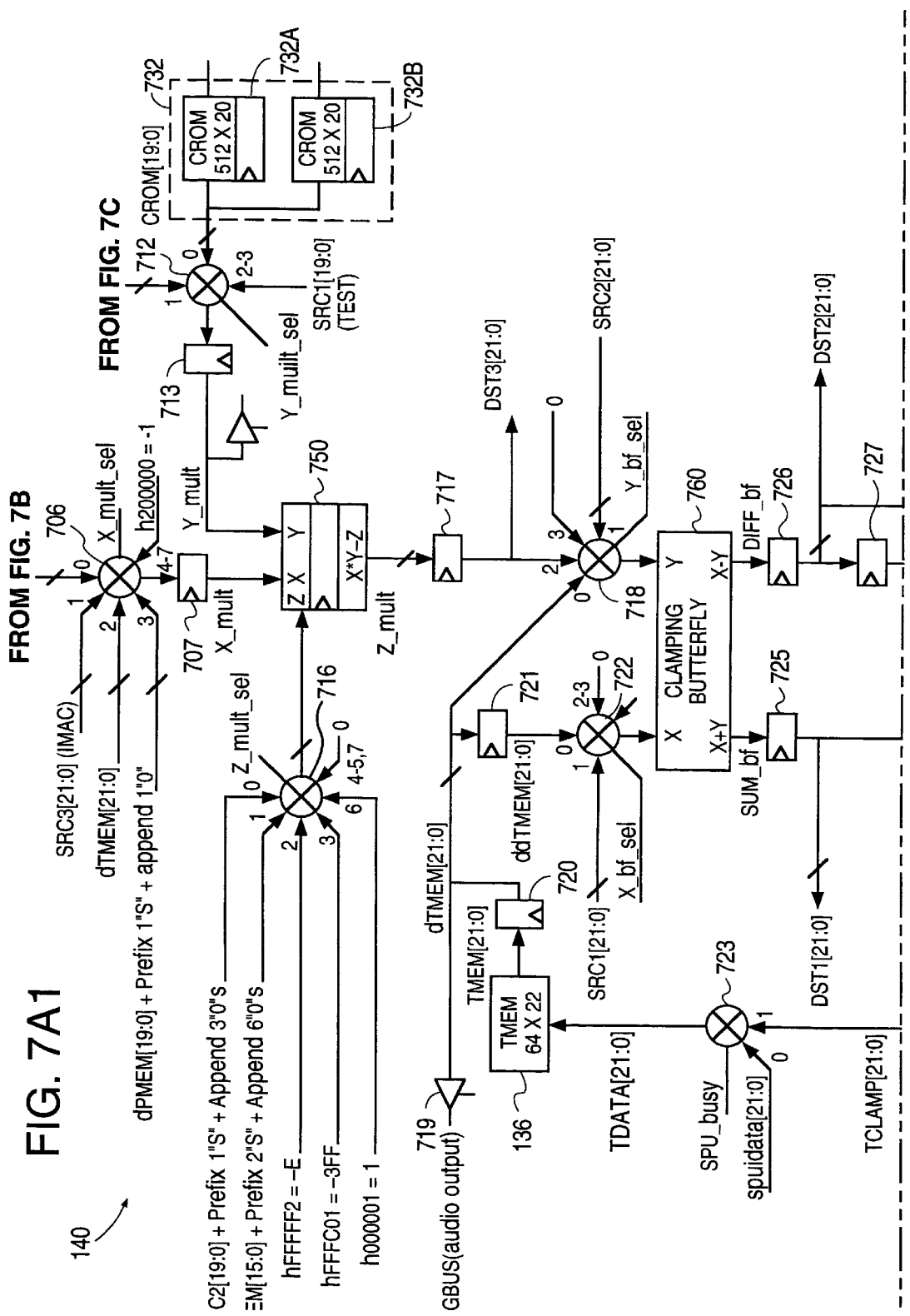

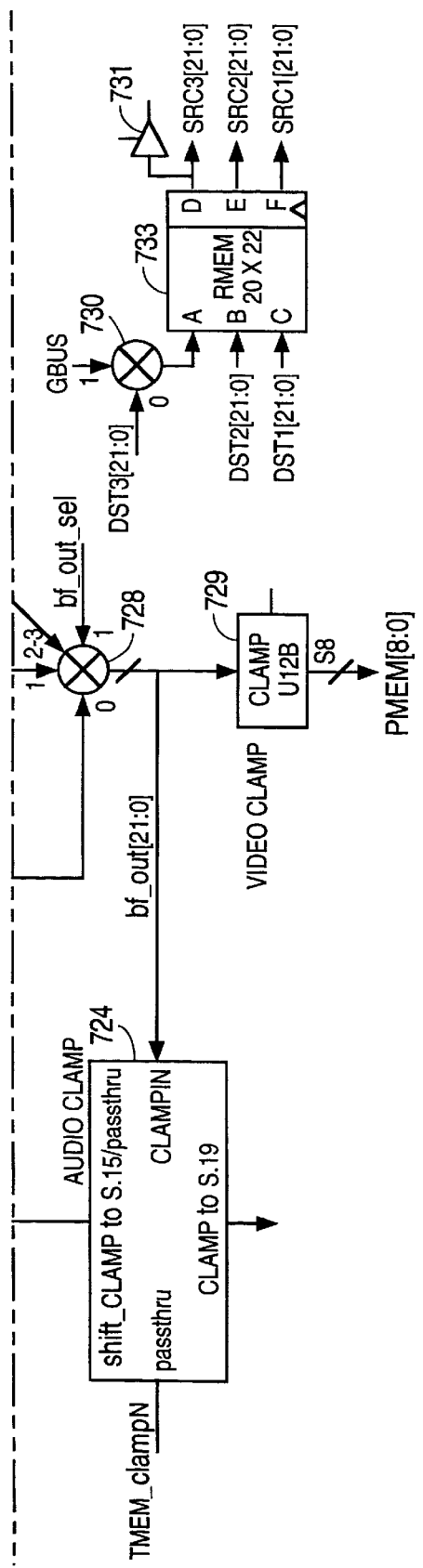

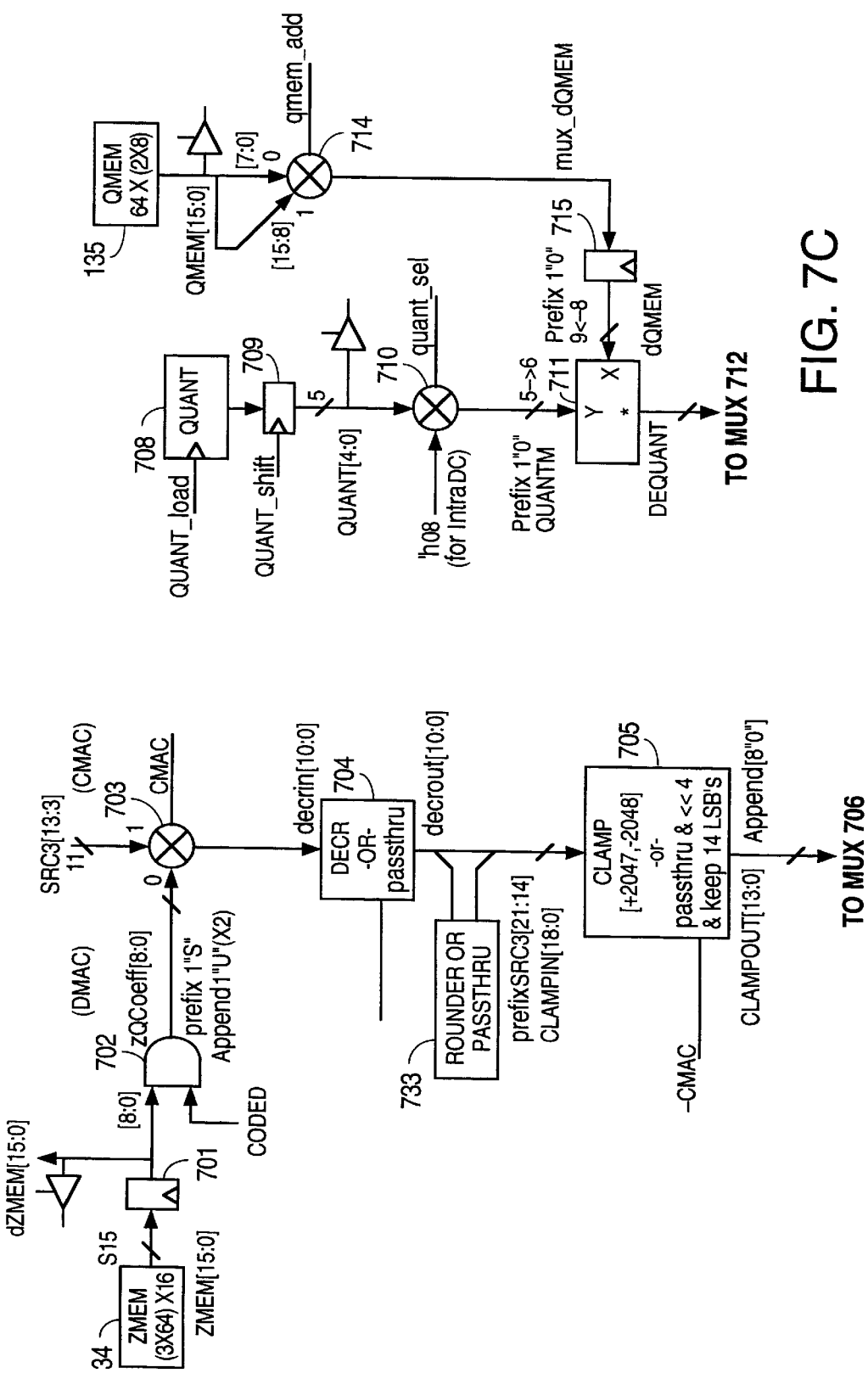

WINDOWING METHOD FOR DECODING OF MPEG AUDIO DATA

CROSS REFERENCE TO RELATED APPLICATION

This is a divisional of U.S. patent application Ser. No. 08/311,659, filed Sep. 23, 1994, now U.S. Pat. No. 5,649,029 which is a continuation-in-part of U.S. patent application Ser. No. 08/288,652 entitled "A Variable Length Code Decoder for Video Decompression Operations," filed Aug. 10, 1994, now abandoned which is a continuation of U.S. patent application Ser. No. 07/890,732, filed May 28, 1992 (now abandoned) which was a continuation-in-part of U.S. patent application Ser. No. 07/669,818, entitled "Decompression Processor for Video Applications," filed Mar. 15, 1991 (now abandoned), all of which are incorporated by reference in their entirety.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

Field of the Invention

This invention relates to decoders for generating audio signals from digital data, and in particular to combined audio and video decoding according to the MPEG standard.

Description of Related Art

The Motion Picture Experts Group (MPEG) developed an international standard (sometimes referred to herein as the "MPEG standard") for representation, compression, and decompression of motion pictures and associated audio on digital media. The International Standards Organization (ISO) publication, No. ISO/IEC 11172: 1993 (E), entitled "Coding for Moving Pictures and Associated Audio—for digital storage media at up to about 1.5 Mbit/s," describes the MPEG standard and is incorporated by reference herein in its entirety. The MPEG standard specifies coded digital representations of audio and video and is intended for continuous data transfer from equipment such as compact disks, digital audio tapes, or magnetic hard disks, at rates up to 1.5 Mbits per second.

Under the MPEG standard, parallel data streams or time multiplexed data streams provide video data frames and audio data frames. Methods and systems for decompressing video data frames are described in U.S. patent applications Ser. Nos. 07/890,732 and 07/669,818 which were incorporated by reference above. Audio data frames contain a header, side information, and subband data. Subband data indicate frequency-domain vectors that are converted to time-domain output sound amplitudes by a transformation (matrixing) and a smoothing filter (windowing).

Typically, MPEG audio/video decoding systems for decoding digital data include, two decoders, one for audio decoding and one for video decoding, on two separate integrated circuit chips. The audio decoder and video decoder are separated because of the differences between MPEG audio coding techniques and MPEG video coding techniques, but separate audio and video decoders increase the amount of circuitry in and the cost of an audio/video decoding system. A decoding architecture is needed that reduces the amount of circuitry and the cost of decoding MPEG audio and video data.

SUMMARY OF THE INVENTION

In accordance with this invention, an MPEG audio/video decoder integrated on a single chip uses components such as memories, a main CPU, a memory controller, and a signal processing unit (SPU) for both audio and video decoding. The SPU contains a multiplier (or multiply-and-accumulate unit) and a butterfly unit which together alternately decode video data and audio data. The combination of a multiplier and a butterfly unit is efficient for both audio and video decoding. In particular, for audio decoding, determining particular sums and differences of the components of a frequency-domain vector with a butterfly unit reduces the number of multiplies required for matrixing (i.e. determining a component of a time-domain vector from a frequency-domain sample vector). Determining combinations of the components can be performed in series with dequantizing and descaling of the components combined. Additionally, matrixing and windowing (i.e. combining a present time-domain vectors with previous time-domain vectors) are combined in a single instruction to increase throughput of a decoder by increasing parallel use of the multiplier, the butterfly unit, and a memory controller which reads and writes to an external memory.

Also in accordance with this invention, a degrouping circuit for decoding MPEG standard subband codes includes a divider which uses three clock cycles to perform two divisions which convert a MPEG subband code into three vector components. Performing two divides in three clock cycles instead of two allows the divider to be smaller and less costly, but does not slow decoding because three clock cycles is the time required to write three vector components into a single-port memory. Accordingly, the smaller divider does not significantly increase the time required to degroup subband codes and write the resulting components into memory. Using the known limits on input dividends of the divider, the size and cost of the divider can be further reduced from that of a general purpose divider.

Also in accordance with this invention, in response to an error signal from an external source of an MPEG audio data stream, an MPEG audio decoder replaces errors in the audio data stream with an error code which is a bit combination rarely found in MPEG audio data frames, and then temporarily enables error handling. The audio data stream containing error codes can be saved or bufferred in the decoder. During audio decoding with error handling enabled, the decoder checks the audio data for the bit combination equaling the error code and replaces the bit combination with reconstructed data. The replacement attempts to minimize the audible effects of an error. Typically, some subband data is replaced with zeros so that an error causes some of the frequency components to be lost.

BRIEF DESCRIPTION OF THE DRAWINGS

FIGS. 3A, 3B, and 3C show a block diagram, a logic table, and a gate level diagram of a divide-by-three circuit in accordance with this invention.

FIGS. 4A, 4B, and 4C show a block diagram, a logic table, and a gate level diagram of a divide-by-five circuit in accordance with this invention.

FIGS. 7A, 7B, and 7C show a block diagram of an embodiment of a signal processing unit in accordance with an embodiment of this invention.

Use of the same reference symbols in different figures indicates similar or identical elements.

DETAILED DESCRIPTION OF THE PREFERRED EMBODIMENTS

In accordance with this invention, an audio/video decoder decodes MPEG standard data streams to provide an audio signal and a video signal. The audio/video decoder alternates between decoding video data frames and decoding audio data frames and employs the same memories and signal processing unit (SPU) for both audio and video decoding.

Figure 1:
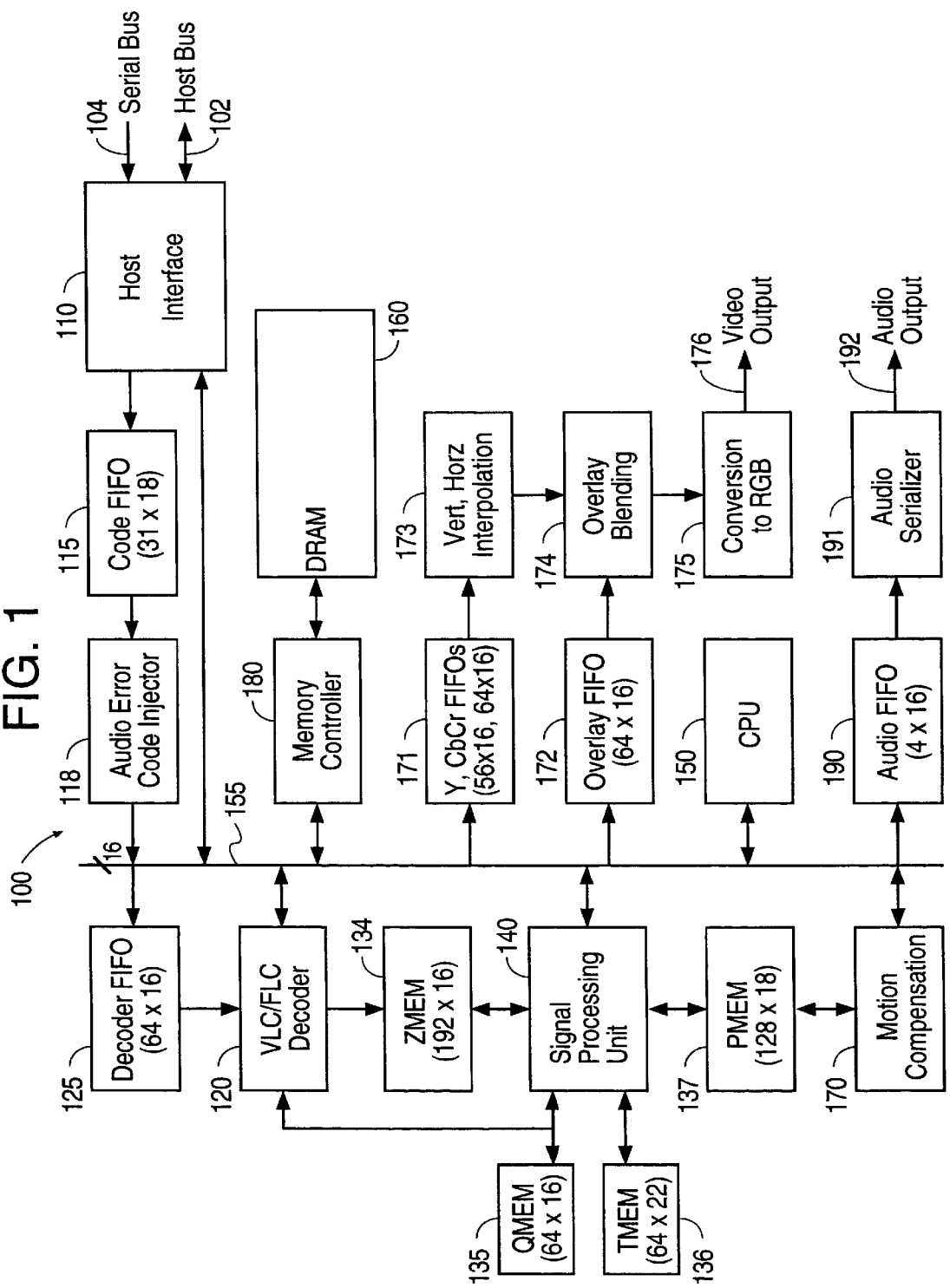
FIG. 1 shows a block diagram of an MPEG audio/video decoder in accordance with an embodiment of this invention.

FIG. 1 shows a block diagram of an audio/video decoder 100 for decoding MPEG standard audio and video data frames. Decoder 100 receives MPEG standard coded audio and video data via a serial bus 104, decodes the audio and video data, and provides the decoded data over a video bus 176 and an audio bus 192. Decoder 100 includes static random access memories (SRAMs) 134 to 137 (also referred to herein as ZMEM 134, QMEM 135, THEM 136, and PMEM 137) which alternate between holding video data for video decoding and holding audio data for audio decoding, and a signal processing unit (SPU) 140 which includes an instruction memory, a register file, a multiplier or a multiply-and-accumulate unit (MAC), and a butterfly unit for decoding and decompressing video data or audio data depending on whether decoder 100 is currently decoding video or audio.

Audio/video decoder 100 interfaces with a source of audio and video signals such as a host computer and a compact disk digital signal processor (CD-DSP) over a host bus 102 and serial bus 104. Serial bus 104 carries a stream of compressed audio and video data following the MPEG standard, which decoder 100 receives through a first-in-first-out (FIFO) buffer 115 ("code FIFO 115"). A memory controller 180 reads the compressed data from code FIFO 115 via a main bus 155 and writes the compressed data to an external memory 160 (also referred herein as DRAM 160). As disclosed below, an audio error code injector 118 can inject error codes into audio data written to DRAM 160. A central processing unit (CPU) 150, which is a microcoded processor having its own instruction memory controls access to main bus 155 and in particular, sends commands to memory controller 130 which cause the data transfer from code FIFO 115 to DRAM 160.

In this embodiment, DRAM 160 contains dynamic random access memory (DRAM) components. Other suitable memory technologies can also be used. DRAM 160 holds compressed data from serial bus 104 and decompressed data for output to an audio bus 192 or a video bus 176. Under the direction of CPU 150, memory controller 180 transfers compressed audio or video data to a decoder FIFO 125 for decoding of an audio data frame or a video data frame by SPU 140.

According to the MPEG standard, a video data frame is a compressed digital description of a picture and an audio data frame is a digital description of a fixed number of frequency-domain sound samples in up to two sound channels. The MPEG standard for video data frames and decoding of video data frames to produce a video signal are described in U.S. patent applications Ser. Nos. 07/890,732 and 07/669,818 which were incorporated by reference above. The MPEG standard currently defines three types of audio data frames referred to as layer 1, layer 2, and layer 3 data frames. Decoder 100 in FIG. 1 decodes layer 1 and layer 2 audio data frames. Layer 1 and layer 2 audio data frames contain a header, side information, and subband data. The header indicates: the bitrate of the data stream providing the audio data frames; the sample frequency of the decoded sound; whether the subband data contains one or two sound channels; and a mode extension describing whether the sound channels in the subband data are independent, stereo, or intensity stereo. The side information indicates the number of bits allocated per subband in the subband data and an index to scalefactors F for dequantizing and descaling subband data as described below.

CPU 150 controls the percentage of time SPU 140 spends decoding audio data. For audio decoding, CPU 150 directs memory controller 180 to move audio data from DRAM 160 to decoder FIFO 125 and directs SPU 140 to perform the calculations necessary for decoding audio data. SPU 140 operates in parallel with CPU 150 and executes commands according to software stored in an instruction memory in SPU 140.

When decoding an audio data frame, SPU 140 first executes a "get bits" command which loads the header and side information of the audio data frame, from decoder FIFO buffer 125, through a VLC/FLC decoder 120, into CPU 150. The CPU 150 writes bit allocations and scalefactors from the side information through SPU 140, into QMEM 135. Header and side information pass through VLC/FLC decoder 120 unchanged. Subband data follows the side information in the data stream from decoder FIFO buffer 125. VLC/FLC decoder 120 contains circuits for decoding variable length codes (VLC) in video data and fixed lengthcodes (FLC) in audio and video data. VLC/FLC decoder 120 also contains degrouping circuits for audio data as described below.

A "get subbands" command executed by SPU 140 causes VLC/FLC decoder 120 to parse and convert subband codes Ci from decoder FIFO buffer 125 into 192 scaled and quantized components Si". VLC/FLC decoder 120 performs degrouping as required and writes the scaled and quantized components Si" into ZMEM 134. Each frequency-domain vector S" has 32 components Si" in 32 frequency ranges (subbands i). The "get subbands" command writes components Si" for three frequency-domain vector S" in each channel (six vectors S" total for two channels) to ZMEM 134. For intensity stereo, some of the frequency components Si" are used by both channels. VLC/FLC decoder 120 writes two copies of components that are shared by the channels so that each vector S" in ZMEM 134 has 32 components Si". For monophonic sound, VLC/FLC decoder 120 can write two copies of all components Si" so that both channels of a stereo output signal are the same. The number of vectors S" in an audio data frame depends on the number of channels and whether the audio data frame follows layer 1 or layer 2 of the MPEG standard. Under layer 1, there are 12 vectors S" (384 samples) per channel. Under layer 2, there are 36 vectors S" (1152 samples) per channel.

SPU 140 executes a "dequant/descale" command to generate components Si of frequency-domain vectors S by descaling and dequantizing values Si" from ZMEM 134. SPU 140 writes a representation of a vector S to a portion of TNEM 136. Matrixing as described below transforms a frequency-domain vector S to a time-domain vector V. SPU 140 stores components Vi of a time-domain vector V in PMEM 137, and memory controller 180 writes components Vi from PMEM 137 to DRAM 160. Components from 16 consecutive time-domain vectors $V^0$ to $V^{16}$ from DRAM 160 are combined in a windowing process described below, and the combination is accumulated in TMEM 136 to provide 32 time-domain output sound amplitudes Ai. Time-domain output sound amplitudes Ai are typically written to an audio output FIFO buffer in DRAM 160, and written as required from DRAM 160 through main bus 155, an output audio FIFO 190, and an audio serializer 191 to audio output bus 192. Output audio FIFO buffer 190 holds enough output sound amplitude values so that at the fastest sampling rate expected delayed access to main bus 155 does not interrupt sound. Audio serializer 191 converts the output audio data to a serial data stream, and a digital-to-analog converter (DAC) and amplifier (not shown) generate a sound from the audio data.

The side information indicates the number of possible values for each quantized component Si" (and each subband code Ci) in a subband i. For example, if subband codes Ci in subband i have 0, 2, 4, . . . , or $2^N$ possible values, then 0, 1, 2, . . . , or N bits are used for each code Ci. If no bits are used for a subband i, VLC/FLC decoder 120 writes zero into ZMEM 134 for components Si", and vector S has less than 32 non-zero components. For a bit allocation representing $2^N$ possible values for a subband i, VLC/FLC decoder 120 uses the bit allocations from the side information in QMEM 135 to identify the start and end of a component Si" in the data stream and writes component Si" to a word aligned location in ZMEM 134.

The MPEG standard allows components Si" to have 3, 5, or 9 possible values and encodes three components S1i", S2i", and S3i" from subband i of three different vectors S1, S2, and S3 into a single code Ci. For example, there are 27 possible combinations of three quantized and scaled components S1i", S2i", and S3i" if each has three possible values 0, 1, or 2. A 5-bit subband code Ci given by eq. 1 represents the 27 possible combinations.

$$Ci=3^2 \cdot S3i"+3 \cdot S2i"+S1i" \quad \text{(eq. 1)}$$

Similarly, a 7-bit code Ci given by eq. 2 represents three components S1i", S2i", and S3i" having five possible values 0 to 4 each.

$$Ci=5^2 \cdot S3i"+5 \cdot S2i"+S1i" \quad \text{(eq. 2)}$$

Eq. 3 gives a 10-bit code Ci representing three components S1i", S2i", and S3i" which each have 9 possible values, 0 to 8.

$$Ci=9^2 \cdot S3i"+9 \cdot S2i"+S1i" \quad \text{(eq. 3)}$$

VLC/FLC decoder 120 degroups a code Ci into three components S3i", S2i", and S1i" given by eqs. 1 to 3 before writing the scaled and quantized components S3i", S2i" and S1i" to ZMEM 134. Two divisions are sufficient to degroup a code Ci given by eqs. 1 to 3. For example, if Ci=$x^2 \cdot$S3i"+ x·S2i"+S1i" and components S3i", S2i" and S1i" are less than x, dividing Ci by x provides a quotient Q1 and a remainder R1 given by eq. 4.

$$(Ci/x)=Q1=x \cdot S3i"+S2i" \text{ with remainder}$$

$$R1=S1i" \quad \text{(eq. 4)}$$

Dividing by x again provides a quotient Q2 and a remainder R2 given by eq. 5.

$$(Q1/x)=Q2=S3i" \text{ with remainder}$$

$$R2=S2i" \quad \text{(eq. 5)}$$

If ZMEN 134 has a single port connected to VLC/FLC 120, three clock cycles are required to write components S3i", S2i", and S1i". Accordingly, VLC/FLC decoder 120 can use three clock cycles for two divides which degroup a code Ci, and not cause a pipeline delay in writing components S3i", S2i", and S1i".

Figure 2:
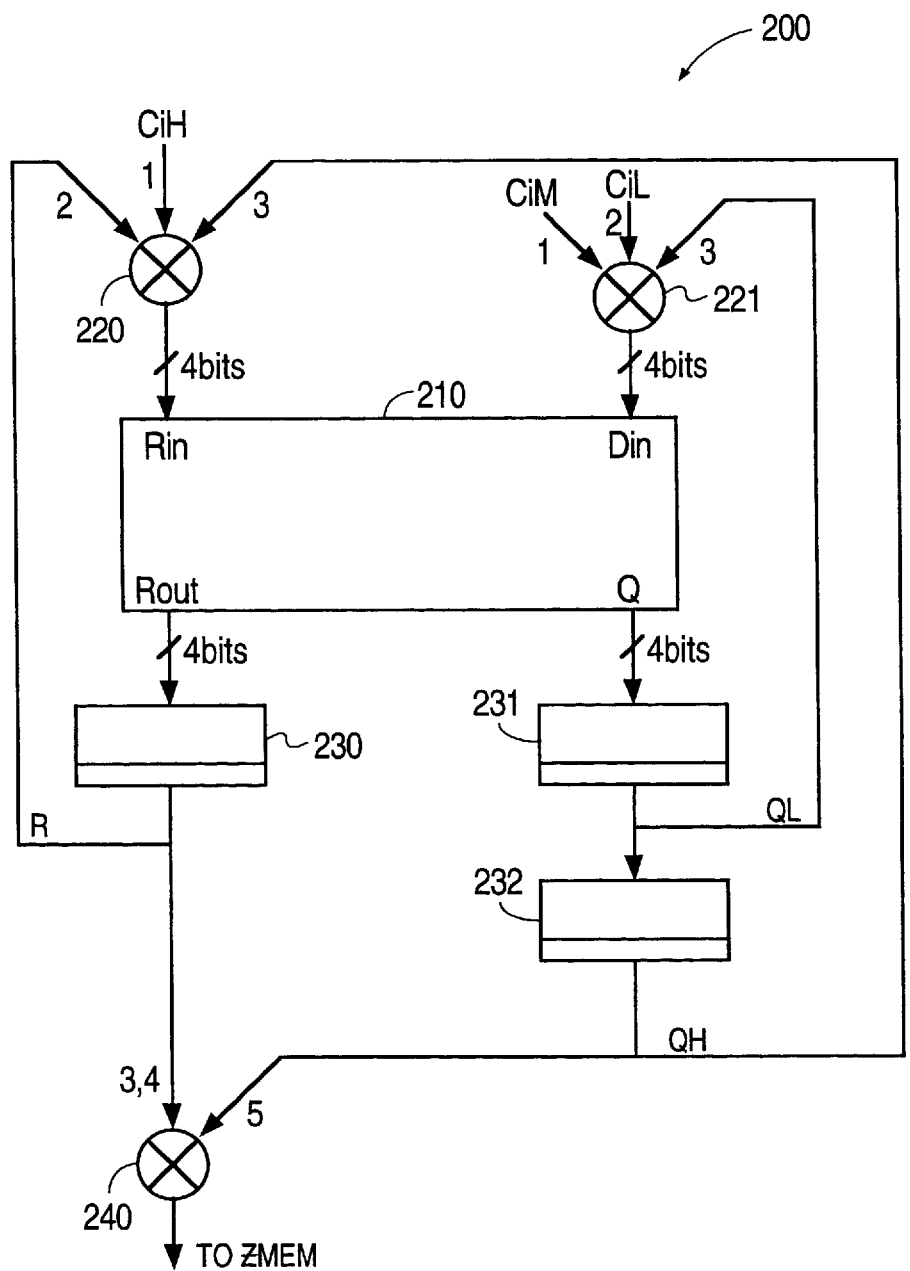
FIG. 2 shows a block diagram of a degrouping circuit in accordance with an embodiment of this invention.

FIG. 2 shows decoding circuit 200 which performs two divides for degrouping a code Ci in three clock cycles. The first divide is an extended divide that takes two clock cycles. The second divide takes one clock cycle. Using two clock cycles for the first divide permits use of a smaller divider and reduces the cost of VLC/FLC decoder 120. In the embodiment of FIG. 2, a divider 210 receives dividend values from multiplexers 220 and 221 and divides the dividend values by a divisor x equal to 3, 5, or 9 to produce a quotient Q and a remainder Rout. Side information gives the bit allocation for each subband and determines the value of divisor x for each subband which requires degrouping.

Code Ci is partitioned into three parts CiH, CiM, and CiL for the first divide of degrouping.. CiL contains the 2, 3, or 4 least significant bits of code Ci for divisor x equal to 3, 5, or 9 respectively. CiM contains the next 2, 3, or 4 more significant bits of code Ci, and CiH contains the most significant 1, 1, or 2 bits of Ci for divisor x equal to 3, 5, or 9 respectively. CiH is padded on the left with zeros to 2, 3, or 4 bits;

Degrouping proceeds as follows. During a first clock cycle, multiplexers 220 and 221 assert signals CiH and CiM to divider 210, and divider 210 produces a quotient Q1H and a remainder R1' which are written to registers 231 and 230 at the end of the first clock cycle. Registers 230 and 231 in the embodiment of FIG. 2 are edge triggered devices, but in alternative embodiments, registers 230 and 231 may be latches, memory locations, or any devices capable of holding and asserting digital data signals. During a second clock cycle, multiplexers 220 and 221 assert respectively remainder R1' from register 230 and signal CiL to divider 210, and divider 210 produces a quotient Q1L and remainder R1. At the end of the second clock cycle, quotient Q1L and remainder R1 are written to registers 231 and 230 respectively, and quotient Q1H is written from register 231 to a register 232. Quotients Q1H and Q1L are respectively the most significant and least significant bits of the quotient Q1 given in eq. 4. Remainder R1 is value S1i" as in eq. 1, 2, or 3.

During a third clock cycle, multiplexers 220 and 221 assert respectively signals Q1H and Q1L from registers 230 and 231 to divider 210, divider 210 produces quotient Q2 and remainder R2 that are given in eq. 5, and a multiplexer 240 selects value R1 from register 230 for writing to a memory such as ZMEM 134 of FIG. 1. At the end of the third clock cycle, quotient Q2 and remainder R2 are written to registers 231 and 230, and the quotient Q1L is written from register 231 to register 232.

During a fourth clock cycle, remainder R2 which equals S2i" passes through multiplexer 240 and is written to the memory. Quotient Q2 is written to register 232 at the end of the fourth clock cycle. Quotient Q2 which equals S3i" is written to memory during the fifth clock cycle. A first divide for a second code Ci' can be performed during the fourth and fifth clock cycles and can proceed as disclosed above. Accordingly, if a series of codes C are degrouped, degrouping proceeds with a pipeline delay only for the first code in the series.

Any known or yet to be developed digital divider circuit may be employed for divider 210 providing the divider circuit handles the correct size dividend, quotient, and remainder. FIG. 3A shows a block diagram of a divide-by-three circuit 300 which uses the limits on the values of codes C to reduce the number of gates and transistors required. Divide-by-three circuit 300 contains two identical circuit blocks 310 and 320. Each block 310 and 320 has input terminals for a 1-bit dividend signal C and a 2-bit remainder signal Rin and output terminals for a 1-bit quotient signal Q and a 2-bit remainder signal Rout. Output remainder signal Rout from block 310 is asserted as input remainder signal Rin of block 320. When used in divider 210 of FIG. 2, divide-by-three circuit 300 has a remainder bus 312 connected to multiplexer 220 (FIG. 2), dividend buses 311 and 321 connected to multiplexer 221, remainder output bus 324 connected to register 230, and quotient output buses 313 and 323 connected to register 231. Multiplexers (not shown) may provide the connections which select divide-by-three circuit 300 in response to the corresponding bit allocation of a subband.

FIG. 3B shows a logic table relating the input signals Rin and C to output signals Rout and Q for each of circuit blocks 310 and 320. During the first clock cycle, the maximum input signal Rin applied to bus 312 equals the maximum signal CiH which is 01 because code Ci contains only five bits. The maximum remainder for any divide-by-three is 10 binary, and the maximum quotient Q1 of eq. 4 is 0100 binary (26 divided by 3 is 8 with remainder 2). Accordingly, input signal Rin which equals CiH, the most significant bits of Q1, or a remainder should never be 11 binary.

The logic table in FIG. 3B reflects the reduced possibilities by indicating output signals Q and Rout as x (don't care) when signal Rin represents 11. The remaining entries are generated by dividing 3-bit values by three. FIG. 3C shows a gate level diagram which implements the logic of FIG. 3B. Counting inverters which invert input signals A,. B, and C, the implementation of FIG. 3C requires 30 transistors per block 310 or 320. Many other circuits can implement the logic table of FIG. 3B.

Figures 4A, 4B:
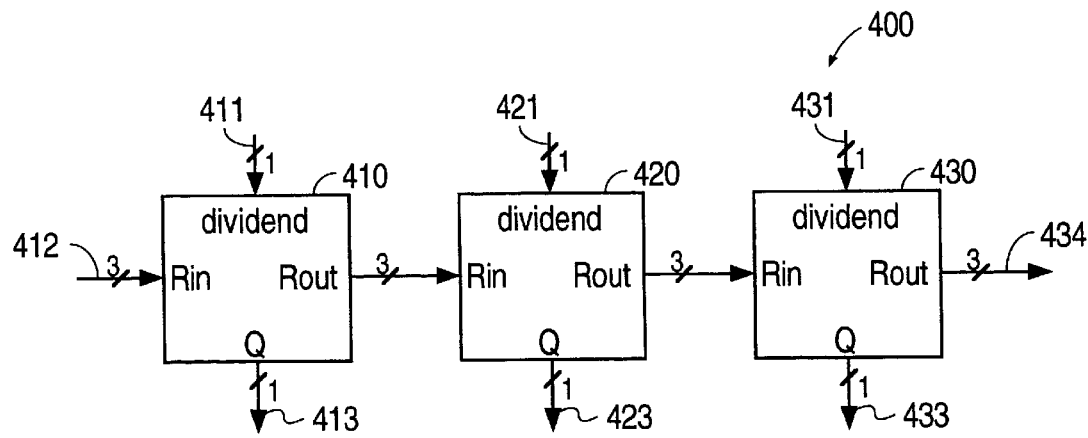

FIG. 4A shows a block diagram of a divide-by-five circuit 400 which uses the limits on the values of codes C to reduce the number of gates and transistors required to divide by five. Divide-by-five circuit 400 contains three identical blocks 410, 420, and 430 each of which have input terminals for a 3-bit remainder signal Rin and a 1-bit dividend signal Din and output terminals for a 3-bit output remainder signal Rout and a 1-bit quotient signal Q. The output remainder signal Rout of block 410 is asserted as the input remainder signal Rin of block 420, and the output remainder signal Rout of block 420 is asserted as the input remainder signal Rin of block 430.

When used in divider 210 of FIG. 2, divide-by-five circuit 400 has a remainder bus 412 connected to. multiplexer 220 (FIG. 2), dividend buses 411, 421, and 431 connected to multiplexer 221, remainder output bus 434 connected to register 230, and quotient output busses 413, 423, and 433 connected to register 231. Multiplexers may provide the connections which select divide-by-five circuit 400 in response to the bit allocation of five values per subband component.

FIG. 4B shows a logic table relating the possible input signals Rin and D for each block 410, 420, and 430 to the desired output signals Q and Rout. FIG. 4C shows a gate level diagram of a circuit which implements the logic table of FIG. 4B. The implementation shown requires 48 transistors for each of blocks 410, 420, and 430. Other implementutions of the logic table of FIG. 4B are possible in accordance with this invention.

Figure 5A:
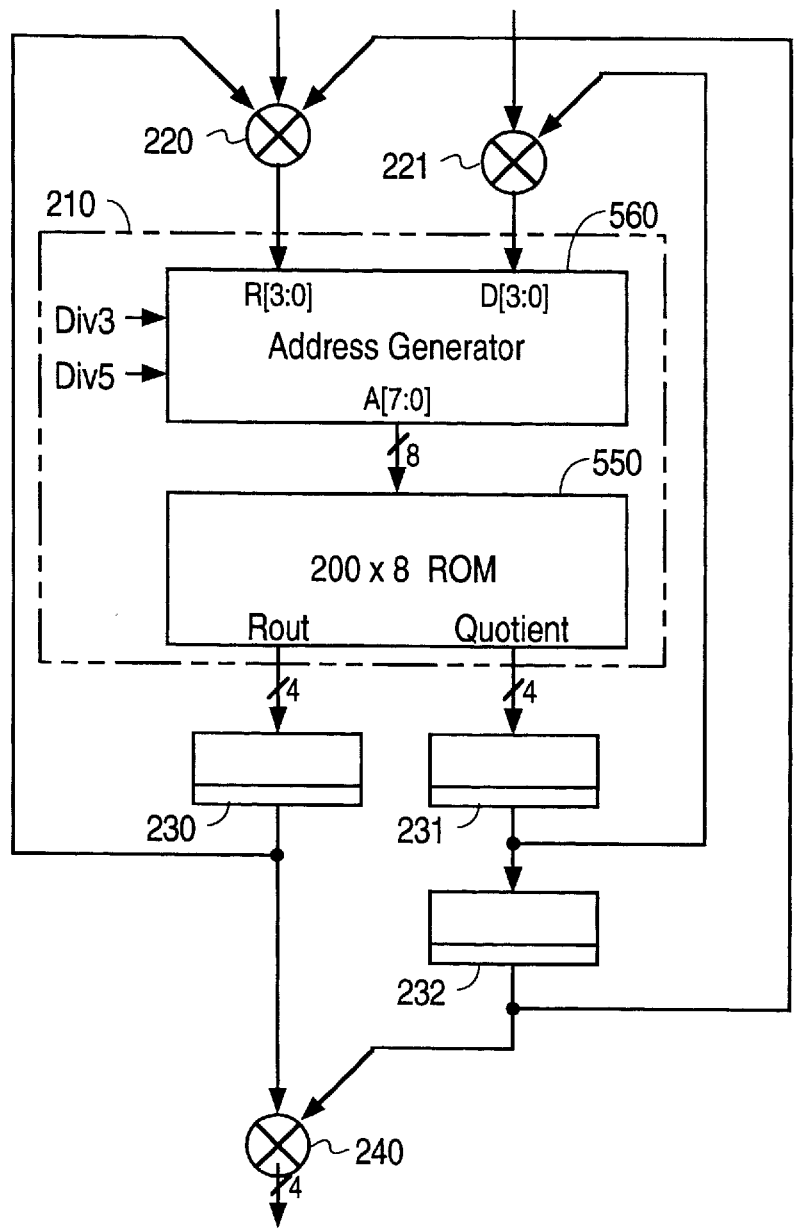
FIGS. 5A and 5B show a block diagram of another embodiment of the degrouping circuit and a gate level diagram of an address generator for dividing by three, five, or nine in accordance with this invention.

FIG. 5A shows a decoding circuit 500 which uses a ROM 550 and an address generator 560 to divide a dividend by nine, five, or three. Two control signals Div3 and Div5 are active high to indicate a divide-by-three and a divide-by-five respectively. When both signals Div3 and Div5 are low, an 8-bit dividend indicated by signals R[3:0] and D[3:0] is divided by nine. For a divide-by-nine, signals R[3:0] and D[3:0] pass through address generator 560 unaltered, and provide an address signal A[7:0] to ROM 550. ROM 550 holds 8-bit values where the four most significant bits. and the four least significant bits equal the remainder and quotient respectively that results from dividing an 8-bit dividend R[3:0]:D[3:0] by nine. ROM 550 holds 145 8-bit values at addresses 00000000 to 10001111 for dividends between 0 and 10001111 binary. This range exhausts the possible dividends to be divided by nine because the largest remainder R[3:0] is 1000 (eight).

Figure 5B:
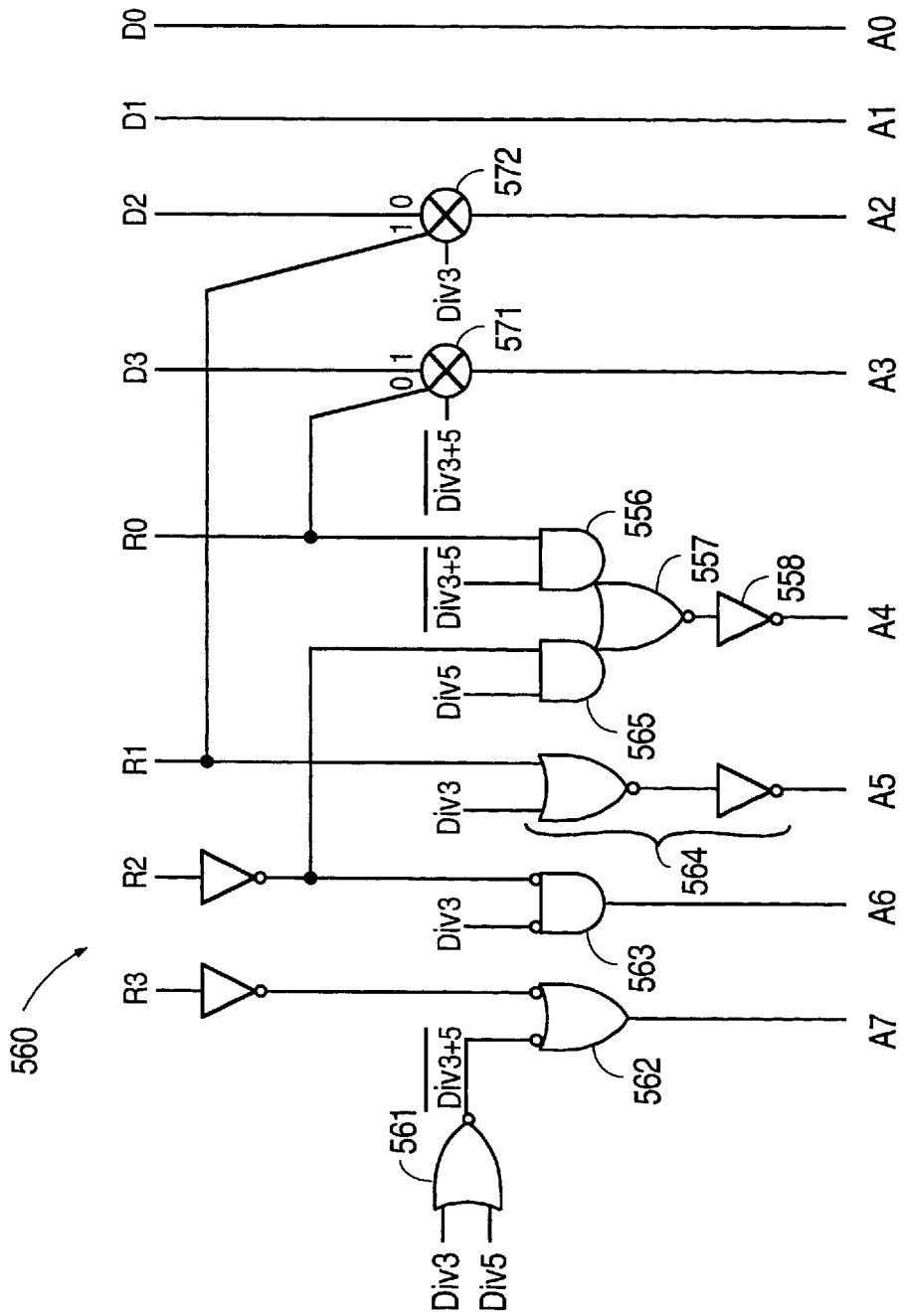

When Div5 is high, divider 210 divides a 6-bit quotient by five. Input bits R3 and D3 in signals R[3:0] and D[3:0] are always zero, and input bits R0, R1, R2, D0, D1, and D2 provide the 6-bit quotient. As shown in FIG. 5B, address generator 560 contains logic which sets address bits A7 to A0 of address signals A[7:0] to 1, R2, R1, $\overline{R2}$, R0, D2, D1, D0 respectively, where $\overline{R2}$ is the complement of R2. This provides addresses for all 6-bit dividends given by signals R[2:0] and D[2:0]. The addresses for divide-by-five are greater than 10001111 binary and therefore do not overlap the addresses for divide-by-nine.

When Div3 is high, divider 210 divides a 4-bit quotient by three. Input bits R3, R2, D3, and D2 are zero, and input bits R0, R1, D0, and D1 provide the 4-bit quotient. As shown in FIG. 5B, address generator 560 contains logic which sets bits A7 to A0 of address signals A[7:0] to 1, 0, 1, 0, R0, R1, D1, D0respectively when signal Div3 is high. This provides addresses for all 4-bit quotients. The addresses for divide-by-three are greater than 10001111 binary and have address bits A6 and A4 equal to zero. Accordingly, addresses for divide-by-three do not overlap the addresses for divide-by-nine which are less than 1000111 or the addresses for divide-by-five which have address bit A6 complementary to address bit A4.

ROM 550 contains 199 8-bit output values. The highest required address is 11000111 binary which contains a remainder and a quotient for 100111 divided. by five. The largest possible remainder signal R[2:0] is 100 binary (four) for a divide-by-five and limits the largest quotient.

VLC/FLC decoder 120 of FIG. 1 identifies and degroups subband codes Ci in a data stream from decoder FIFO buffer 125 and writes quantized and scaled values Si" into ZMEM 134. ZMEN 134 has 192 16-bit words of storage, enough to hold components of six sample vectors S". 192 words of storage are required because in some cases, a subband code Ci provides values S1i", S2i", and S3i" for three vectors S1", S2", and S3" and subband codes for two channels are interleaved in the data stream under the MPEG standard. Accordingly, in the worst case, components from six different vectors (three in each channel) must be decoded before one complete vector S" is known.

In the embodiment of FIG. 1, after SPU 140 instructs VLC/FLC decoder 120 to get subband data, VLC/FLC decoder 120 reads the bit allocation per subband from QMEM 135, reads subband codes C from decoder FIFO buffer 125, degroups subband codes C (if necessary), and writes the scaled and quantized components Sim for six vectors to ZMEM 134, all without intervention from SPU 140. This frees SPU 140 for other operations. In alternative embodiments, SPU 140 can take greater control of reading and degrouping of subband codes. For example, SPU 140 can read the bit allocation for each subband, and VLC/FLC decoder 120 can degroup each subband in response to separate commands from SPU 140. VLC/FLC decoder 120 can also be eliminated if SPU 140 performs degrouping of values from decoder FIFO buffer 125. SPU 140 is inactive when VLC/FLC 120 is performing the "get subbands" command because ZMEM 134 does not have space for more than six vectors. However, VLC/FLC decoder 120 as described above may perform faster degrouping than using SPU 140. and therefore increases throughput of decoder 100.

Scaled and quantized components Si" correspond to components Si as indicated in eqs. 6 and 7, $$Si'=K1\cdot(Si''+K2) \quad (eq.\ 6)$$

$$Si=F\cdot Si' \quad (eq.\ 7)$$

where constants K1 and K2 depend on the number of bits used to represent values Si", and the side information of the audio data frame provides an index which indicates scalefactor F. Applying eq. 6 to a value Si"is sometimes referred to herein as dequantizing. Applying eq. 7 to a value Si' is sometimes referred to herein as descaling. Combinations of dequantized and descaled vector components Si of a vector S are combined as described below and stored in TMEM 136. TMEM 136 contains sixty four 22-bit storage locations, 32 storage locations for a vector S, and 32 locations for accumulating a set of 32 output sound amplitudes Ai as described below.

Determining output sound amplitudes Ai from sample vector S in THEM proceeds in steps referred to herein as matrixing and windowing. Matrixing produces a vector V by performing the equivalent of matrix multiplication of frequency-domain sample vector S by a transformation matrix N given by the MPEG standard. The components Nji of matrix N are $$Nji=\cos[(16+j)(2i+1)\pi/64] \quad (eq.\ 8)$$

where $0 \leq J \leq 63$ and $0 \leq i \leq 31$. Matrix N is a 32-by-64 matrix which contains only 31 different positive values A to Z and AA to AE as shown in Appendix A. The remaining components of matrix N are either 0, −1, or are the negative of one of the values A to Z or AA to AE. Eq. 8 indicates the values A to Z and AA to AE.

Vector V has 64 components Vj given by eq. 9.

$$Vj = \sum_{i=0}^{31} Nji \cdot Si \quad (eq.\ 9)$$

32 components Vj of vector V are linearly independent.

Determination of each component Vj of vector V, except V16 and V48, requires 32 multiplications of components Si of vector S by components Nji of matrix N, according to eq. 9. (V16 is always 0, and V48 is the negative of the sum of the components Si.) Using a butterfly unit to determine combinations T0 to T31, sums and differences, of components S0 to S31, reduces the number of multiplications. An example of a set of combinations T0 to T31 which reduces the number of multiplications required to generate vector V is shown in Appendix B. Appendix C shows the equations that give the components V0 to V63 of vector V in terms of the combinations T0 to T31. Components Si and intermediate values used to calculate T0 to T31 are temporarily stored in a register file of SPU 140.

The equations of Appendix C are equivalent to eq. 9 but require fewer multiplications and therefore are calculated more quickly in a digital system. In vector V, component V16 is always zero. Components with an index which are a multiple of four, V(4n), each require 4 multiplications. Components with an index equal to one or three plus a multiple of four, V(4n+1) or V(4n+3), each require 16 multiplications. Components with an index equal to two plus a multiple of four, V(4n+2), each require 8 multiplications. Components V0 to V15 and V49 to V63 are either the same or the negative of components V32 to V17 and V47 to V33. In SPU 140, a MAC 750 shown in FIG. 7A, multiplies combinations T0 to T31 by quantities stored in a ROM 732 to determine 32 linearly independent components such as components V17 to V48 of vector V. Components V17 to V48 are stored in PMEM 137 and written in the order V48 to V17 to external DRAM 160. Alternative embodiments may use other linearly independent sets of components or other orders. As described below, the order of the components written to DRAM 160 determines how windowing is performed.

Successive vectors S for a channel are converted to vectors V in sequential order from the data stream for one or more audio data frames. A superscript is sometimes used herein to distinguish the sequential order of vectors V (or S). The components of a vector $V^0$ just determined from a vector $S^0$ are written to DRAM 160 over the oldest vector components for the channel. The components of 15 vectors $V^{-1}$ to $V^{-15}$ are in DRAM 160 while vector $V^0$ is being determined. Windowing combines components from the just determined vectors $V^0$ with the components of the 15 preceding vectors $V^{-1}$ to $V^{-15}$ to provide output sound amplitude values Ai.

According to the MPEG standard, 32 output sound amplitudes Ai are given by $$Ai = \sum_{k=0}^{15} U(i=32k) \cdot D(i+32k) \quad (eq.\ 10)$$

where $0 \leq i \leq 31$, vector U has a first set of components defined by $U(64m+i)=V^{2m}i$ and a second set of components defined by $U(64m+32+i)=V^{-(2m+1)}(32+i)$ for $0 \leq m \leq 7$, and $D(i+32k)$ is a component of a 512 component vector given by the MPEG standard. Eq. 10 requires 64 components of sixteen vectors $V^0$ to $V^{15}$ for windowing even though each vector has only 32 independent components. Storing only the independent components in DRAM 160 reduces the required size of DRAM 160, the time to write the components after matrixing, and the time to retrieve components for windowing.

As shown in Appendix C, each vector V contains 32 linearly independent components. Components V1 to V15 to equal the negative of components V17 to V32 respectively. Component V16 equals 0. Components V33 to V47 equal components V63 to V49 respectively, and V48 is independent. Only a linearly independent set such as components V48 to V17 is required for windowing if some of the components are multiplied by values D(i+32k) of eq. 10.

As can be seen from eq. 10, one of the first 32 components $V^{2m}i$ from each vector $V^{2m}$ and one of the last 32 components $V^{-(2m+1)}(32+i)$ from each vector $V^{-(2m+1)}$ contribute to an output sound amplitude Ai. The first 32 components of each vector V contains only 16 independent values. The last 32 components of each vector V contains 17 independent values. Accordingly, a total of 33 values from two vectors $V^{-2m}$ and $V^{-(2m+1)}$ are sufficient to determine the contributions of vectors $V^{-2m}$ and $V^{-(2m+1)}$ to 32 output sound amplitudes Ai during windowing. Storing the 33 values at consecutive addresses in DRAM 160 increases the speed of reading the values for windowing because consecutive addresses can be accessed with a minimum number of page changes.

Figure 6:
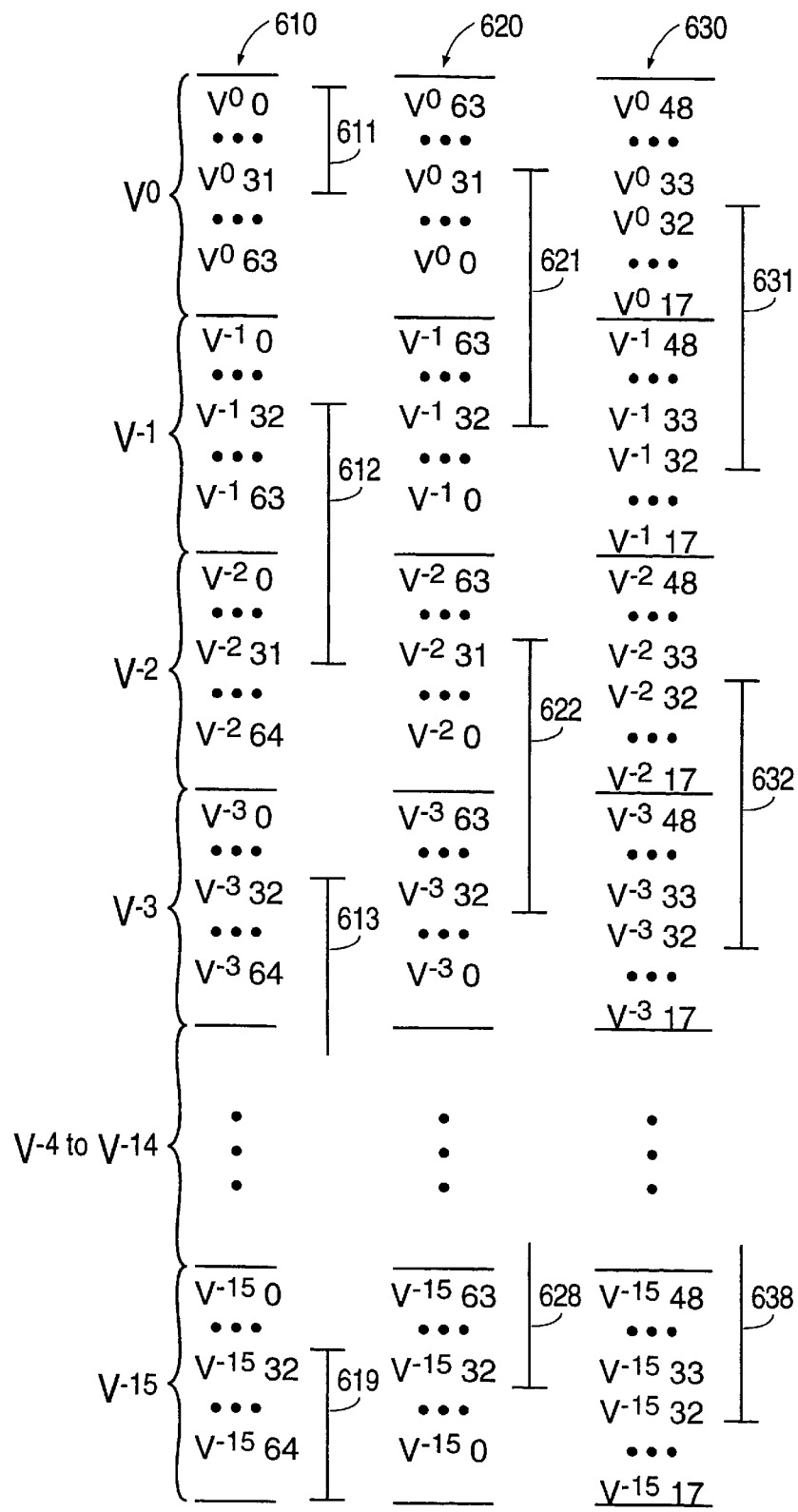
FIG. 6 shows memory maps of previous vector components used during a windowing process in accordance with this invention.

FIG. 6 shows three alternate memory maps 610, 620, and 630 for a section of DRAM 160 of FIG. 1. In the memory map 610, vectors $V^0$, $V^{-1}$, $V^{-2}$, $V^{-3}$, ... $V^{-15}$ are stored consecutively with components in order from the lowest to highest index. For windowing according to eq. 10, determination of 32 output amplitudes Ai requires the first 32 components of each of vectors $V^0$, $V^{-2}$, ... $V^{-14}$ and the last 32 components of each of vectors $V^{-1}$, $V^{-3}$, ... $V^{-15}$. Reading components for windowing requires transfers from seven blocks 612, 613, ... of 64 consecutive addresses and two blocks 611 and 619 of 32 consecutive addresses. Typically, each of the nine transfers from blocks 611 to 619 requires at least one access to a new page. For a typical DRAM, transfers which require changing pages require extra clock cycles for addressing and therefore take longer than transfers from a current page. Storing the components of vectors $V^0$ to $V^{-15}$ in order of decreasing index as shown in memory map 620 reduces the number of transfers to eight blocks 621 to 628 of 64 consecutive addresses.

Memory map 630 stores only 32 linearly independent components Vi for index i ranging from 48 to 17 per vector $V^0$ to $V^{-15}$. In alternate embodiments, the set of linearly independent components and the order of the components may be changed if suitably matched windowing coefficients D(i+32k) are employed. For memory map 630, windowing requires transfers from eight blocks 631 to 638 of 33 consecutive addresses, and the number of bytes transferred is cut nearly in half. In practice, at least one block of 33 vector components is not at consecutive addresses because the current vector $V^0$ can be in any of sixteen positions in memory and is not always at the lowest address as shown in memory map 630. In any case, transfers from memory map 630 are less likely to include a page break than transfers from memory map 620 because block transfers 631 to 638 are smaller than block transfers 621 to 628.

Returning to FIG. 1, components of vectors $V^0$ to $V^{-15}$ are transferred from memory map 630 (FIG. 6) of DRAM 160 into PMEM 137. The transferred components are multiplied by windowing coefficient D(i+32k) from eq. 10, and the products of the transferred components and windowing coefficients are accumulated in TMEM 136. Once contributions from sixteen vectors are accumulated, windowing is complete, and the 32 accumulated sound amplitude values Ai in TMEN 136 are written to the audio output FIFO buffer in DRAM 160. SPU 140 performs dequantizing, descaling, matrixing, and windowing for all sample vectors S in ZMEM 134, and then more vectors are loaded into ZMEM 134 in response to "get subbands" commands. After reading all of the subband information in the audio data frame, SPU 140 may be used for decoding of MPEG video data frames while a DAC (not shown) reads decoded sound amplitudes from DRAM 160 through audio output FIFO buffer 190.

Circuit blocks 170 to 175 in decoder 100 implement video decoding. Block 170 performs half-pixel offsetting and adding of reference blocks to error terms in accordance with the MPEG standard. Blocks 171 to 175 form a video output unit of audio/video decoder 100. Memory controller 180 transfers decoded video data from DRAM 160, to video FIFOs 171. Interpolator 173 expands the decoded video data by two horizontally and by two vertically. Video overlay data such as data representing lyric text is read from DRAM 160 into overlay FIFO 172, and block 174 blends the overlay data with data from interpolater 173 to provide pixel values. Converter 175 optionally converts the pixel values from a YCbCr color representation to a RGB color representation which is transmitted on video output bus 176.

FIGS. 7A, 7B, and 7C show a block diagram of a signal-processing unit 140 in accordance with this invention. SPU 140 has an instruction memory (not shown) and a control unit (not shown) which executes a decoding program stored in the instruction memory. SPU 140 decodes audio and video data frames using information stored in memories 134 to 137. FIG. 7A shows portions of SPU 140 for audio decoding. ZMEN 134 is a (3×64)×16 bit SRAM and is large enough to store six vectors S" each containing thirty two 16-bit components Si", during audio decoding. During video decoding, ZMEM 134 is a "zig-zag" memory which stores two or three sets of 64 9-bit video coefficients. QMEM 135 is a 64×(2×8) memory. During audio decoding, QMEM 135 holds 32 subband bit allocations and scalefactor indices for each of two sound channels. During video decoding, QMEM 135 holds two sets of 64 8-bit components of video quantizer matrices according to the MPEG standard. Quantizer matrices are swapped between QMEM 135 and DRAM 160 as required when switching between video and audio decoding.

For audio decoding, a VLC/FLC decoder 120 writes six quantized and scaled vectors S" to ZMEM 134 as described above. SPU 140 performs a "dequant/descale" instruction and "window/matrix" instructions on each vector S" in ZMEM 134. The dequant/descale instruction determines combinations T0 to T31 from a vector S" by dequantizing, descaling, and butterfly operations. For descaling, a 16-bit component Si" from ZMEM 134 is fed through a multiplexer 716 as an input value Z of MAC 750. A multiplexer 706 asserts a value X equal to −1 to a register 707 coupled to MAC 750, and multiplexer 712 asserts a value Y which equals K2 as given in eq. 6, from ROM 732 to a register 713 coupled to MAC 750. MAC 750 determines the product of value X and value Y and then subtracts value Z. A register 717 captures the output value from MAC 750 which can be written to a multiported register file 733 which has three read ports and three write ports. The value Si"+K2 is stored to register file 733. In a second pass through MAC 750, multiplexer 706 asserts signal X equal to Si"+K2 from register file 733, through register 707, to MAC 750. Multiplexer 712 asserts signal Y equal to K1 (eq. 6) from ROM 732, through register 713, to MAC 750. Multiplexer 716 asserts a value Z equal to zero. The output signal of MAC 750 is a dequantized value Si' which is again written to register file 733.

ROM 732 contains two ROMs 732A and 732B which are alternately accessed to provide ROM 732 with twice the read speed of ROMs 732A and 732B. ROM 732 contains constants for dequantizing, descaling, matrixing, windowing, and video decoding. The control unit of SPU 140 determines the correct address in ROM 732 from the side information in QMEM 135.

Dequantized value Si' is asserted through multiplexer 706 as a value X for descaling. Descaling is performed in two multiplications. For the first multiplication, multiplexer 712 and register 713 provide a first scalefactor F1 which is one of 1, $2^{-\frac{1}{3}}$, and $2^{-\frac{2}{3}}$ from ROM 732 according to an index from the side information in QMEM 135. Value Z from multiplexer 716 is zero. The resulting partly descaled value is held by register 717, stored to register file 733, and asserted through multiplexer 706 and register 707 as value X for the second multiply. Multiplexer 712 and register 713 provide a second scalefactor F2 which is one of $2^{-1}$ to $2^{-20}$ from ROM 732 according to the index from the side information in QMEM 135, and again value Z is zero. The product of F1 and F2 equals scalefactor F of eq. 8. Descaling with two multiplications reduces round-off error which might result from a single multiplication by scalefactor F which is small.

The dequantized and descaled value Si is written to register file 733, and SPU 140 dequantizes and descales a second component Sk" from ZMEK 134 in the same manner as described above. When component Sk" is dequantized and descaled to provide component Sk, butterfly unit 760 calculates the sum and the difference of Si and Sk. Calculation of sums and differences is conducted in parallel with dequantizing and descaling other components. Components Si" are descaled and dequantized in an order that facilitates calculation of sums and differences T0 to T31 shown in Appendix B.

One example dequantizes and descales components S0, S31, S15, S16, S7, S24, S8, and S23 in that order for a determination of sum T28. Butterfly unit 760 determines the sum and difference of S0 and S31 while MAC 750 determines components S15 and S16. A register 725 holds the sum S0+S31 for writing into register file 733. A register 726 holds difference (S0−S31)=T0, which passes through a register 727, a multiplexer 728, an audio clamp 724, and a multiplexer 723 to be written in TMEM 136. Subsequently, butterfly unit 760 determines the difference (S15−S16)=T15 which is similarly stored in TMEM 136 and the sum (S15+S16) which is temporarily stored in register file 733. Next, butterfly unit 760 determines the sum and difference of the sums (S0+S31) and (S15+S66). The difference (S0+S31)−(S15+S16)−T15 is saved to TMEM 136. The sum (S0+S31)+(S15+S16) is temporarily stored in register file 733. The same calculations as performed on S1, S31, S15, and S16 are performed on S7, S24, S8, and S23 to determine (S7−S24)=T7, (S8−S23)=T8, (S7+S24)−(S8+S23)−T23, and (S7+S24)+(S8+S23). Butterfly unit 760 then combines values (S0+S31)+(S15+S16) and (S7+S24)+(S8+S23) from register file 733 to determine difference T24 [(S0+S31)+(S15+S16)]−[(S7+S24)+(S8+S23)] and sum T28 [(S0+S31)+(S15+S16)]−[(S7+S24)+(S8+S23)], both of which are stored in TMEM 136. The remaining components of vector S are dequantized in parallel with operation of butterfly unit 760 in the order as required to determine sums T29 to T31 of Appendix B.

After all combinations T0 to T31 are determined and stored in TMEM 136, SPU executes a window/matrix instruction. Combinations T0 to T31 are asserted to MAC 750 through multiplexer 706 and register 707. MAC 750 multiplies combinations T0 to T31 by matrixing coefficients from ROM 732 as given in Appendix C to determine components V17 to V48. Butterfly unit 760 performs additions or subtractions needed to accumulate components V17 to V48 which are passed through registers 726 and 727, multiplexer 728, and clamp 729 to be saved in PMEM 137. The number of multiplications required is 4, 8, or 16 per component Vi depending on the index.

Windowing filters vector components Vi which result from matrixing. For each window/matrix instruction, memory controller 180 reads sets of 33 previous vector components as in memory map 630 of DRAM 160, into PMEM 137 with the 33 previous vector components from oldest vectors (from vectors $V^{-15}$ and $V^{-14}$) being read from DRAM 160 first. The previous vector components in PMEM 137 are fed through multiplexer 706 and register 707 to MAC 750. MAC 750 multiplies the previous vector components by windowing coefficients D(i+32k) and accumulates the product into 32 sound amplitude values being accumulated in TMEM 136. For each set of 33 vector components, 64 multiplies are performed, and two values are accumulated for each sound amplitude value.

Matrixing and windowing of a vector requires eight window/matrix instructions. Each window/matrix instruction determines and stores into DRAM 160 four components of a vector $V^0$, and accumulates two windowing contributions for each of 32 sound amplitude values Ai. Before the first window/matrix instruction, old sound amplitude values Ai must be saved from TMEM 136 to DRAM 160. Saving old sound amplitude values can be performed simultaneously with dequantizing and descaling of a new vector if TMEM 136 is dual ported or if writes to TMEN 136 during the dequantizing and descaling process can be stalled. Otherwise window/matrix instruction must wait until old sound amplitude values are saved to DRAM 160. Window/matrix instruction also must wait until dequantizing and descaling of the current vector is complete.

Initially, memory controller 180 transfers 33 vector components from DRAM 160 to a first portion of PPEM 137. For the MPEG standard, vector components are kept to 20 bits of accuracy, but standard DRAM have 16-bit storage locations. Accordingly, 33 vector components are stored at 42 addresses in DRAM 160. PMEN 137 is 18 bits wide for holding two 9-bit video error terms. Vector components are stored in PMEM 137 in 42 addresses as received from DRAM 160. Once the 33 vector components are in PMEM 137, SPU 140 begins executing a window/matrix instruction on the first portion of PMEM 137 and retrieves 20-bit components as required. The window/matrix instruction accumulates the windowing contributions of the 33 components in PMEM 137 to the sound amplitude values Ai in TMEM 136 and determines a set of four vector components of the current vector $V^0$. It should be noted that each set of four vector components V17 to V20, V21 to V24, V25 to V28, V29 to V32, V33 to V36, V37 to V40, V41 to V44, and V45 to V48 if determined by the equations in Appendix C requires 44 multiplications. The set of four vector components determined by matrixing are stored in PMEM 137.

Simultaneously with execution of the window/matrix instruction, memory controller 180 transfers 33 more vector components from DRAM 160 to a second portion of PMEM 137. When a window/matrix instruction is complete, four vector components are written from PMEN 137 to DRAM 160, and then another window/matrixing instruction begins using the second portion of PMEM 137. The eighth and final window/matrix instruction for a vector $V^0$ uses components of vector $V^0$ for windowing. Since windowing only requires components $V^017$ to $V^033$ windowing, the necessary components for windowing are calculated and stored in DRAM 160 in previous window/matrix instructions before being retrieved for windowing. After theeighth window/matrix instruction, the 32 sound amplitude values Ai are ready for transfer from TMEM 136 to DRAM 160. Audio clamp 724 clamps the accumulated sound amplitude values. Ai to 16 bits for writing to DRAM 160. If dequantizing and descaling is not stallable, SPU 140 waits while memory controller 180 transfers sound amplitude values Ai to DRAM 160.

An advantage of the combined window/matrix step arises because multiply time limits matrixing, and windowing is slightly limited by memory access to DRAM 160. Combining windowing and matrixing provides an instruction that more evenly utilizes the resources of SPU 140 and decoder 100. Additionally, if the windowing and matrixing were not combined transfers from DRAM 160 to video FIFOs 171 and 172 (and FIFOs 125, 115, and 190) would delay windowing. By combining windowing and matrixing, transfers from DRAM 160 to video FIFOs 171 and 172 can overlap the window/matrix computations because matrixing does not use much DRAM bandwidth. Matrixing only needs to write four 20-bit values to DRAM 160.

Figure 8A:
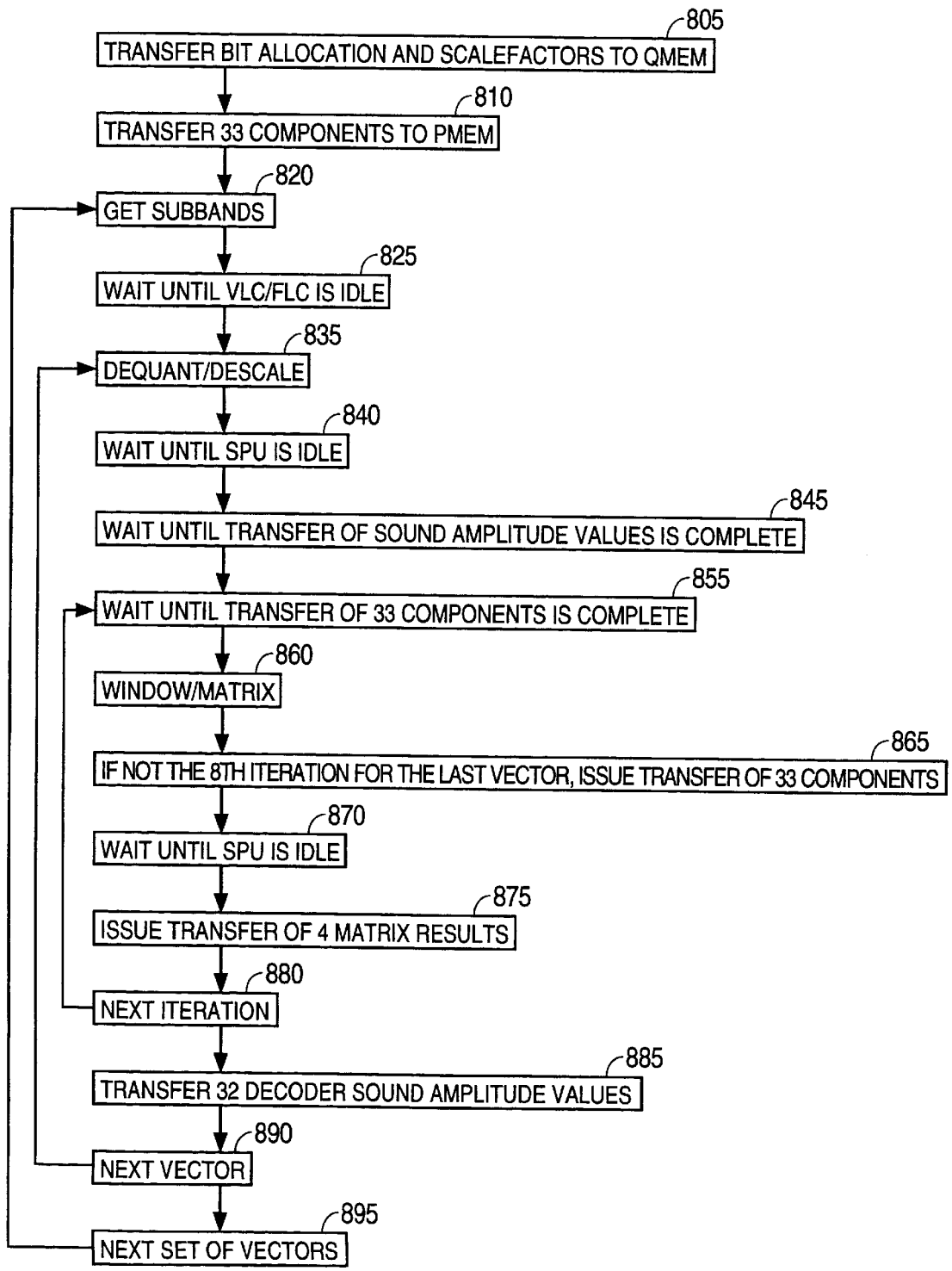
FIG. 8A shows a flow diagram of an audio decoding process in accordance with this invention.
Figure 8B:
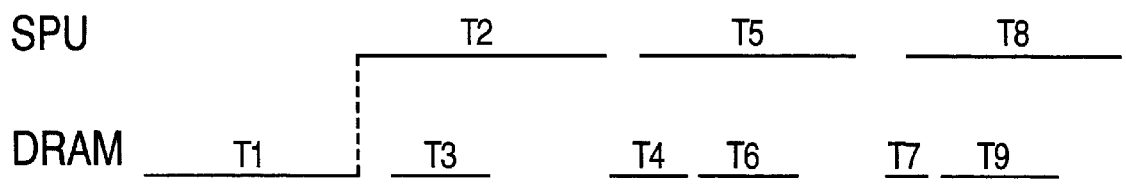
FIG. 8B shows a timing diagram for the process of FIG. 8A.

FIG. 8A illustrates a process loop executed by CPU 150 for audio data frame decoding, and FIG. 8B shows the timing of the process loop. Initially, in step 805, CPU 150 loads QMEM 135 with scalefactor indices and bit allocations for a layer 1 audio data frame or for part of a layer 2 audio data frame and then in step 810, requests that memory controller 180 transfer 33 vector components from DRAM 160 to PMEM 137. The 33 vector components are transferred to a first half of PMEM 137 during time T1 (FIG. 8B). Meanwhile, CPU 150 issues a get subbands command in step 820 that VLC/FLC decoder 120 executes in parallel with the transfer during time T1. The get subbands command as disclosed above moves components for six vectors into ZMEM 134. CPU 150 waits in step 825 until VLC/FLC decoder 120 is idle before issuing a dequant/descale command in step 835. SPU 140 performs the dequant/descale command in parallel with the transfer during time T1.

SPU 140 can not proceed from the dequant/descale command to a window/matrix command until transfer of 33 vector components requested in step 810 is complete because the 33 vector components are required for windowing. SPU requires the results of the dequant/descale command (step 835) for matrixing. Additionally, window/matrix commands can not begin until previously determined sound amplitude values are saved from TMEM 136 to DRAM 160. Accordingly, CPU 150 waits in steps 840, 845, and 855 before directing SPU 140 to execute a window/matrix command in step 860. During a time T2, the window/matrix command is performed as disclosed above. In step 865, CPU 150 requests that memory controller 180 transfer 33 more vector components from DRAM 160 to a second half of PMEM 137. The transfer of 33 more components occurs during time T3 in parallel with the window/matrix command of step 860. Memory controller 180 does not interfere with data being used by SPU 140 because memory controller 180 and SPU 140 access different halves of PMEM 137.

CPU 150 waits in step 870 until SPU 140 completes the window/matrix command, before requesting in step 875 that memory controller 180 transfer to DRAM 160 four vector components just determined by the window/matrix command. The transfer to DRAM 160 occurs during a time T4. CPU 150 transitions through step 880 back to step 855 and waits until the 33 components requested in step 865 are transferred to the second half of PMEM 137. Decoding proceeds as disclosed above except that a second window/matrix command of step 860 operates on the second half of PMEM 137, and a second execution of step 865 request a transfer of 33 vector components to the first half of PMEM 137. SPU 140 executes the second window/matrix command during a time T5 and in parallel with transfer of the previously four vector components to DRAM 160 during time T4 and then in parallel with transfer of the next set of 33 vector components from DRAM 160 during time T6 as shown in FIG. 8B.

Steps 855 to 880 are repeated eight times. In each iteration, steps 860 and 865 alternate operating on the first and second halves of PMEM 137. During an eighth iteration of steps 855 to 880, vector components for windowing the next vector are requested in step 865 unless the vector is the last vector of the last set of vectors. After the eight iterations of the window/matrix command,. CPU 150 transitions to step 885 and requests transfer of the 32 just determined sound amplitude values Ai from TMEM 136 to DRAM 160. CPU 150 transitions to step 890 and then step 835 and begins a dequant/descale command for the next vector in ZMEN 134. A loop from step 835 to step 890 is executed six times to decode three vectors in each of two channels. After the six vectors are decoded, CPU 150 jumps from step 895 to step 820 to get subband data for a next set of six vectors. A loop from step 820 to step 895 is executed for four sets of vectors. After four sets of six vectors, new bit allocations and scalefactor indices are needed.

Appendix D contains a C code listing of a program which executes the steps of dequantizing, descaling, matrixing, and windowing as described above.

Audio/video decoder 100 (FIG. 1) of this invention also performs video decoding according to the MPEG standard. Video decoding under the MPEG standard is described in U.S. patent app. Ser. Nos. 07/890,732 and 07/669,818 which were incorporated by reference above. VLC/FLC decoder 120 converts codes in a video data stream from decoder FIFO 125 into quantized discrete cosine transformation (DCT) coefficients which are stored in ZMEM 134. For video decoding, ZMEM 134 is sometimes referred to as a zig-zag memory because of the order in which coefficients are stored. QMEM 135 holds dequantization constants which are swapped into QMEM 135 from DRAM 160 after audio decoding or are changed according to the video data stream. SPU 140 uses the dequantization constants for dequantizing the DCT coefficients.

SPU 140 multiplies the dequantized DCT coefficients by a cosine factor and then converts the DCT coefficients to pixel values by a two-dimensional inverse discrete cosine transformation (IDCT). The two-dimensional IDCT may be performed as two one-dimensional IDCTS, and TMEM 136 is used to hold intermediate values during the IDCT. After the IDCT, the resulting error terms are stored into PMEM 137 and then written to DRAM 160. Decoded video is read from DRAM 160 through blocks 171 to 175 for output on video bus 176.

SPU 140 executes operations including the dequantization, the cosine multiply, and the IDCT described above and in U.S. patent app. Ser. No. 07/890,732. In addition to the blocks shown in FIG. 7A, SPU 140 uses the circuit blocks shown in FIGS. 7B and 7C during a video decoding. During a cosine multiply operation, a multiplexer 712 is set to select a cosine factor from ROM 732 which MAC 750 multiplies by a DCT coefficient. For a dequantization instruction, a dequantization constant is retrieved from QMEM 135 via a multiplexer 714 and a register 715. Multiplexer selects either the most or least significant eight bits of a 16-bit signal from QMEM 135. A multiplier 711 scales the dequantization constant by a value provided by a multiplexer 710. Multiplexer 710 selects either a fixed constant for the DC term of intra macroblocks or a 5-bit scaling factor from registers 708 and 709. Multiplier 711 provides the scaled dequantization constant via multiplexer 712 and a register 713 to MAC 750 for multiplication by a DCT coefficient retrieved from ZMEM 134.

Prior to being asserted to MAC 750, each 9-bit DCT coefficient from ZMEM 134 may be padded, decremented by decrementer 704, made odd or rounded towards zero by rounder 733, or clipped to a predetermined range by clamp 705, according to the requirements of the MPEG standard. AND gate 702 sets a 9-bit DCT coefficient from ZMEM 134 to zero in response to a control signal "coded". During a video dequantization instruction, multiplexer 703 selects output signal decrin [10:.0] equal to an 11-bit signal formed by padding the 9-bit zQCode[8:0] from gate 702, on the right. Alternatively, when executing an instruction other than a dequantization instruction, multiplexer 703 selects signal decrin[10:0] equal to an 11-bit signal SRC3[13:3] from register file 733. Decrementer 704 decrements signal decrin [10:09 when required by the MPEG standard to provide an output signal decrout[10:0]. If a decrement operation is not required, signal decrout equals signal decrin[10:0].

Rounder 733 replaces bits 0 (the LSB) and 4 of the output datum of signal decrout[10:0] if required under the MPEG standard. Rounder 733 zeros signal decrout[10:0] if the DCT coefficient from ZMEM 134 is zero, during execution of a dequantization instruction, or signal SRC3[13:3] is zero, during execution of a non-dequantization instruction (e.g. a cosine multiply instruction). Bits [21:14] of signal SRC3 from the register file 733 prefixes to signal decrout[10:0] resulting in a 19-bit signal CLAMPIN[18:0] which is passed into clamp 705. Clamp 705 clamps signal CLAMPIN[18:0] to a 14-bit signal CLAMPOUT(13:0] having values between −2047 and 2047 during execution of a non-dequantization instruction. Alternatively, during a dequantization instruction, clamp 705 passes the input signal unchanged. Signal CLAMPOUT[13:0] is then zero-padded on the right to form a 22-bit signal passed through multiplexer 706 and register 707 as the signal X to MAC 750.

MAC 750 can, depending on the instruction executed, multiply two numbers X and Y (e.g. in a dequantization or cosine multiply instruction), or compute the value of the expression X*Y−Z (e.g. in an IDCT multiply-subtract instruction). The DCT coefficients are fetched from either ZMEM 134 or TMEM 136 to register file 733. In addition, the resulting value from MAC 750 can be routed as an operand to butterfly unit 760 bypassing register file 733.

Butterfly unit 760 computes simultaneously the sum and the difference of two input operands X and Y. Since MAC 750 and butterfly unit 760 can each operate on their respective operands in parallel during the execution of a multiply instruction, a multiply instruction can result in both a multiplication result and a butterfly result. Additionally, a pipeline is achieved by using the output value (an "intermediate" result) of MAC 750 directly through multiplexer 718 to butterfly unit 760. This arrangement increases throughput because the delay caused by loading then reading an intermediate result in register file 733 is eliminated.

The results from a butterfly operation of a first pass IDCT are routed into TMEM 136, whereas the results from a butterfly operation of a second pass IDCT operation are "clipped" by clamp 729 and routed to PMEM 137. A program executable by SPU 140 for video decoding is described in U.S. patent application Ser. No. 07/890,732.

The MPEG standard does not define an error code that is injected into the audio bit stream because any possible bit combination can validly appear in the bit stream of a layer 1 or layer 2 audio data frame. Instead a CD-DSP may generate a separate-error signal for any audio data byte which includes a detected error. The audio/video decoder 100 of FIG. 1 includes an audio error code injector 118 which when an error signal is received from a CD-DSP, changes a section of audio data received on serial bus 104 to a bit combination that is rare in audio data frames. Code FIFO 115 is 18 bits wide to store two bytes of coded data each with a ninth bit for the error signal. Audio error code injector 118 checks the error bit of the coded data, and if the error bit is set, overwrites the byte with an error code. For example, if decoder 100 receives an error signal while receiving an audio data stream, audio error code injector 118 inserts a 32-bit word aligned value 7FFD7FFD hexadecimal into an audio data frames In this case, the error coded replaces the byte with the error and three other bytes. In a statistical study of MPEG data frames for actual sounds, the 32-bit value $7FFD7FFD was estimated to occur less than once every 100 hours of audio data;

Bytes with errors can not be overwritten with an error code when written into code FIFO 115 because different types of data streams typically use different error codes, and decoder 100 does not identify the type of data stream containing the error until the data is removed from code FIFO 115. For example, audio/video decoder 100 may receive an audio data stream, a video data stream, and a lyric data stream. Errors in the video data stream are overwritten with $000001B4. Errors in the lyric data stream are overwritten with 32 bits of zero.

When an error signal for an audio data frame is received, host interface 110 inserts a 1 into an 8-bit shift register that is shifted once for every audio data packet. Accordingly, the value in the shift register is not zero for a number of audio data frames greater than or equal to the number of shifts required to move the 1 out of the shift register. The value in the shift register is non-zero for the time that an input audio data buffer in DRAM 160 could contain an error code. VLC/FLC decoder 120 checks for bit combinations equal to the error code in all audio frames that are decoded while the value in the shift register is not zero. If the bit combination is detected, the VLC/FLC decoder 120 initiates an error concealment procedure. Bit combinations which are not actual injected error codes are rarely detected because the chances of the bit combination occurring within a short time interval of an audio frame containing an error are small.

The error concealment procedure tries to minimize the effect that the error in the data stream has on sound quality. For example, if the error code occurs in subband data, VLC/FLC decoder 120 replaces the components corrupted by the error code with zeros, so that the generated sound is only missing some frequency components. If the error code corrupts the header or side information of an audio data frame so that the audio data frame can not be decoded, VLC/FLC decoder 120 generates an interrupt to CPU 150. CPU 150 can try to reconstruct the missing data using previous audio data frames or cause SPU 140 to decode again the previous audio data frame for the channel.

Although the present invention has been described with reference to particular embodiments, the description is only an example of the invention's application and should not be taken as a limitation. Various adaptations and combinations of features of the embodiments disclosed will be apparent to those skilled in the art and are within the scope of the present invention as defined by the following claims.

Appendix A
Matrix Coefficients (Nji)

| | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 0 | P | −P | −P | P | P | −P | −P | P | P | −P | −P | P | P | −P | −P | P |
| 1 | O | −S | −K | W | G | −AA | −C | AE | −A | −AC | E | Y | −I | −U | M | Q |
| 2 | N | −V | −F | AD | −B | −Z | J | R | −R | −J | Z | B | −AD | F | V | −N |
| 3 | M | −Y | −A | AA | −K | −O | W | C | −AC | I | Q | −U | −E | AE | −G | −S |
| 4 | L | −AB | D | T | −T | −D | AB | −L | −L | AB | −D | −T | T | D | −AB | L |
| 5 | K | −AE | I | M | −AC | G | O | −AA | E | Q | −Y | C | S | −W | A | U |
| 6 | J | −AD | N | F | −Z | R | B | −V | V | −B | −R | Z | −F | −N | AD | −J |
| 7 | I | −AA | S | −A | −Q | AC | −K | −G | Y | −U | C | O | −AE | M | E | −W |
| 8 | H | −X | X | −H | −H | X | −X | H | H | −X | X | −H | −H | X | −X | H |
| 9 | G | −U | AC | −O | A | M | −AA | W | −I | −E | S | −AE | Q | −C | −K | Y |
| 10 | F | −R | AD | −V | J | B | −N | Z | −Z | N | −B | −J | V | −AD | R | −F |
| 11 | E | −O | Y | −AC | S | −I | −A | K | −U | AE | −W | M | −C | −G | Q | −2 |
| 12 | D | −L | T | −AB | AB | −T | L | −D | −D | L | −T | AB | −AB | T | −L | D |
| 13 | C | −I | O | −U | AA | −AE | Y | −S | M | −G | A | E | −K | Q | −W | 4 |
| 14 | B | −F | J | −N | R | −V | Z | −AD | AD | −Z | V | −R | N | −J | F | −B |
| 15 | A | −C | E | −G | I | −K | M | −O | Q | −S | U | −W | Y | −AA | AC | −6 |
| 16 | 0 | 0 | 0 | 0 | 0 | 0 | 0 | 0 | 0 | 0 | 0 | 0 | 0 | 0 | 0 | 0 |
| 17 | −A | C | −E | G | −I | K | −M | O | −Q | S | −U | W | −Y | AA | −AC | 6 |
| 18 | −B | F | −J | N | −R | V | −Z | AD | −AD | Z | −V | R | −E | −N | J | −F | B |
| 19 | −C | I | −O | U | −AA | AE | −Y | S | −M | G | −E | K | −Q | W | −4 |
| 20 | −D | L | −T | AB | −AB | T | −L | D | D | −L | T | −AB | AB | −T | L | −D |
| 21 | −E | O | −Y | AC | −S | I | A | −K | U | −AE | W | −M | C | G | −Q | 2 |
| 22 | −F | R | −AD | V | −J | −B | N | −Z | Z | −N | B | J | −V | AD | −R | F |
| 23 | −G | U | −AC | O | −A | −M | AA | −W | I | E | −S | AE | −Q | C | K | −Y |
| 24 | −H | X | −X | H | H | −X | X | −H | −H | X | −X | H | H | −X | X | −H |
| 25 | −I | AA | −S | A | Q | −AC | K | G | −Y | U | −C | −O | AE | −M | −E | W |
| 26 | −J | AD | −N | −F | Z | −R | −B | V | −V | B | R | −Z | F | N | −AD | J |
| 27 | −K | AE | −I | −M | AC | −G | −O | AA | −E | −Q | Y | −C | −S | W | −A | −U |
| 28 | −L | AB | −D | −T | T | D | −AB | L | L | −AB | D | T | −T | −D | AB | −L |
| 29 | −M | Y | A | −AA | K | O | −W | −C | AC | −I | −Q | U | E | −AE | G | S |
| 30 | −N | V | F | −AD | B | Z | −J | −R | R | J | −Z | −B | AD | −F | −V | N |
| 31 | −O | S | K | −W | −G | AA | C | −AE | A | AC | −E | −Y | I | U | −M | −Q |
| 32 | −P | P | P | −P | −P | P | P | −P | −P | P | P | −P | −P | P | P | −P |
| 33 | −Q | M | U | −I | −Y | E | AC | −A | −AE | −C | AA | G | −W | −K | S | O |
| 34 | −R | J | Z | −B | −AD | −F | V | N | −N | V | F | AD | B | −Z | −J | R |
| 35 | −S | G | AE | E | −U | −Q | I | AC | C | −W | −O | K | AA | A | −Y | −M |
| 36 | −T | D | AB | L | −L | −AB | −D | T | T | −D | −AB | −L | L | AB | D | −T |
| 37 | −U | A | W | S | −C | −Y | −Q | E | AA | O | −G | −AC | −M | I | AE | K |
| 38 | −V | −B | R | Z | F | −N | −AD | −J | J | AD | N | −F | −Z | −R | B | V |
| 39 | −W | −E | M | AE | O | −C | −U | −Y | −G | K | AC | Q | −A | −S | −AA | −I |
| 40 | −X | −H | H | X | X | H | −H | −X | −X | −H | H | X | X | H | −H | −X |
| 41 | −Y | −K | C | Q | AE | S | E | −I | −W | −AA | −M | A | O | AC | U | GG |
| 42 | −Z | −N | −B | J | V | AD | R | F | −F | −R | −AD | −V | −J | B | N | Z |
| 43 | −AA | −Q | −G | C | M | W | AE | U | K | A | −I | −S | −AC | −Y | −O | −E |
| 44 | −AB | −T | −L | −D | D | L | T | AB | AB | T | L | D | −D | −L | −T | −3 |
| 45 | −AC | −W | −Q | −K | −E | A | G | M | S | Y | AE | AA | U | O | I | C |
| 46 | −AD | −Z | −V | −R | −N | −J | −F | −B | B | F | J | N | R | V | Z | 5 |
| 47 | −AE | −AC | −AA | −Y | −W | −U | −S | −Q | −O | −M | −K | −I | −G | −E | −C | −A |
| 48 | −1 | −1 | −1 | −1 | −1 | −1 | −1 | −1 | −1 | −1 | −1 | −1 | −1 | −1 | −1 | −1 |
| 49 | −AE | −AC | −AA | −Y | −W | −U | −S | −Q | −O | −M | −K | −I | −G | −E | −C | −A |
| 50 | −AD | −Z | −V | −R | −N | −J | −F | −B | B | F | J | N | R | V | Z | 5 |
| 51 | −AC | −W | −Q | −K | −E | A | G | M | S | Y | AE | AA | U | O | I | C |
| 52 | −AB | −T | −L | −D | D | L | T | AB | AB | T | L | D | −D | −L | −T | −3 |
| 53 | −AA | −Q | −G | C | M | W | AE | U | K | A | −I | −S | −AC | −Y | −O | −E |
| 54 | −Z | −N | −B | J | V | AD | R | F | −F | −R | −AD | −V | −J | B | N | Z |
| 55 | −Y | −K | C | Q | AE | S | E | −I | −W | −AA | −M | A | O | AC | U | G |
| 56 | −X | −h | H | X | X | H | −H | −X | −X | −H | H | X | X | H | −H | −X |
| 57 | −W | −E | M | AE | O | −C | −U | −Y | −G | K | AC | Q | −A | −S | −AA | −I |
| 58 | −V | −B | R | Z | F | −N | −AD | −J | J | AD | N | −F | −Z | −R | B | V |
| 59 | −U | A | W | S | −C | −Y | −Q | E | AA | O | −G | −AC | −M | I | AE | K |
| 60 | −T | D | AB | L | −L | −AB | −D | T | T | −D | −AB | −L | L | AB | D | −T |
| 61 | −S | G | AE | E | −U | −Q | I | AC | C | −W | −O | K | AA | A | −Y | −M |
| 62 | −R | J | Z | −B | −AD | −F | V | N | −N | −V | F | AD | B | −Z | −J | R |
| 63 | −Q | M | U | −I | −Y | E | AC | −A | −AE | −C | AA | G | −W | −K | S | O |

-continued

Appendix A
Matrix Coefficients (Nji)

| | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|
| 0 | P | −P | −P | P | P | −P | −P | P | P | −P | −P | P | P | −P | −P | P |
| 1 | −Q | −M | U | I | −Y | −E | AC | A | −AE | C | AA | −G | −W | K | S | −O |
| 2 | −N | V | F | −AD | B | Z | −J | −R | R | J | −Z | −B | AD | −F | −V | N |
| 3 | S | G | −AE | E | U | −Q | −I | AC | −C | −W | O | K | −AA | A | Y | −M |
| 4 | L | −AB | D | T | −T | −D | AB | −L | −L | AB | −D | −T | T | D | −AB | L |
| 5 | −U | −A | W | −S | −C | Y | −Q | −E | AA | −O | −G | AC | −M | −I | AE | −K |
| 6 | −J | AD | −N | −F | Z | −R | −B | V | −V | B | R | −Z | F | N | −AD | J |
| 7 | W | −E | −M | AE | −O | −C | U | −Y | G | K | −AC | Q | A | −S | AA | −I |
| 8 | H | −X | X | −H | −H | X | −X | H | H | −X | X | −H | −H | X | −X | H |
| 9 | −Y | K | C | −Q | AE | −S | E | I | −W | AA | −M | −A | O | −AC | U | −G |
| 10 | −F | R | −AD | V | −J | −B | N | −Z | Z | −N | B | J | −V | AD | −R | F |
| 11 | AA | −Q | G | C | −M | W | −AE | U | −K | A | I | −S | AC | −Y | O | −E |
| 12 | D | −L | T | −AB | AB | −T | L | −D | −D | L | −T | AB | −AB | T | −L | D |
| 13 | −AC | W | −Q | K | −E | −A | G | −M | S | −Y | AE | −AA | U | −O | I | −C |
| 14 | −B | F | −J | N | −R | V | −Z | AD | −AD | Z | −V | R | −N | J | −F | B |
| 15 | AE | −AC | AA | −Y | W | −U | S | −Q | O | −M | K | −I | G | −E | C | −A |
| 16 | 0 | 0 | 0 | 0 | 0 | 0 | 0 | 0 | 0 | 0 | 0 | 0 | 0 | 0 | 0 | 0 |
| 17 | −AE | AC | AA | Y | −W | U | −S | Q | −O | M | −K | I | −G | E | −C | A |
| 18 | B | −F | J | −N | R | −V | Z | −AD | AD | −Z | V | −R | N | −J | F | −B |
| 19 | AC | −W | Q | −K | E | A | −G | M | −S | Y | −AE | AA | −U | O | −I | C |
| 20 | −D | L | −T | AB | −AB | T | −L | D | D | −L | T | −AB | AB | −T | L | −D |
| 21 | −AA | Q | −G | −C | M | −W | AE | −U | K | −A | −I | S | −AC | Y | −O | E |
| 22 | F | −R | AD | −V | J | B | −N | Z | −Z | N | −B | −J | V | −AD | R | −F |
| 23 | Y | −K | −C | Q | −AE | S | −E | −I | W | −AA | M | A | −O | AC | −U | G |
| 24 | −H | X | −X | H | H | −X | X | −H | −H | X | −X | H | H | −X | X | −H |
| 25 | −W | E | M | −AE | O | C | −U | Y | −G | −K | AC | −Q | −A | S | −AA | I |
| 26 | J | −AD | N | F | −Z | R | B | −V | −V | −B | −R | Z | −F | −N | AD | −J |
| 27 | U | A | −W | S | −Y | Q | E | −AA | O | G | −AC | M | I | −AE | S | K |
| 28 | −L | AB | −D | −T | T | D | −AB | L | L | −AB | D | T | −T | −D | AB | −L |
| 29 | −S | −G | AE | −E | −U | Q | I | −AC | C | W | −O | −K | AA | −A | −Y | M |
| 30 | N | −V | −F | AD | −B | −Z | J | R | −R | −J | Z | B | −AD | F | V | −N |
| 31 | Q | M | −U | −I | Y | E | −AC | −A | AE | −C | −AA | G | W | −K | −S | O |
| 32 | −P | P | P | −P | −P | P | P | −P | −P | P | P | −P | −P | P | P | −P |
| 33 | −O | −S | K | W | −G | −AA | C | AE | A | −AC | −E | Y | I | −U | −M | Q |
| 34 | R | −J | −Z | B | AD | F | −V | −N | N | V | −F | −AD | −B | Z | J | −R |
| 35 | M | Y | −A | −AA | −K | O | W | −C | −AC | −I | Q | U | −E | −AE | −G | S |
| 36 | −T | D | AB | L | −L | −AB | −D | T | T | −D | −AB | −L | L | AB | D | −T |
| 37 | −K | −AE | −I | M | AC | G | −O | −AA | −E | Q | Y | C | −S | −W | −A | U |
| 38 | V | B | −R | −Z | −F | N | AD | J | −J | −AD | −N | F | Z | R | −B | −V |
| 39 | I | AA | S | −A | −Q | −AC | −K | G | Y | U | C | −O | −AE | −M | E | W |
| 40 | −X | −H | H | X | X | H | −H | −X | −X | −H | H | X | X | H | −H | −X |
| 41 | −G | −U | −AC | −O | −A | M | AA | W | I | −E | −S | −AE | −Q | −C | K | Y |
| 42 | Z | N | B | −J | −V | −AD | −R | −F | F | R | AD | V | J | −B | −N | −Z |
| 43 | E | O | Y | AC | S | I | −A | −K | −U | −AE | −W | −M | −C | G | Q | 2 |
| 44 | −AB | −T | −L | −D | D | L | T | AB | AB | T | L | D | −D | −L | −T | −3 |
| 45 | −C | −I | −O | −U | −AA | −AE | −Y | −S | −M | −G | −A | E | K | Q | W | 4 |
| 46 | AD | Z | V | R | N | J | F | B | −B | −F | −J | −N | −R | −V | −Z | −5 |
| 47 | A | C | E | G | I | K | M | O | Q | S | U | W | Y | AA | AC | 6 |
| 48 | −1 | −1 | −1 | −1 | −1 | −1 | −1 | −1 | −1 | −1 | −1 | −1 | −1 | −1 | −1 | −1 |
| 49 | A | C | E | G | I | K | M | O | Q | S | U | W | Y | AA | AC | 6 |
| 50 | AD | Z | V | R | N | J | F | B | −B | −F | −J | −N | −R | −V | −Z | −5 |
| 51 | −C | −I | −O | −U | −AA | −AE | −Y | −S | −M | −G | −A | E | K | Q | W | 4 |
| 52 | −AB | −T | −L | −D | D | L | T | AB | AB | T | L | D | −D | −L | −T | −E |
| 53 | E | O | Y | AC | S | I | −A | −K | −U | −AE | −W | −M | −C | Q | 2 |
| 54 | Z | N | B | −J | −V | −AD | −R | −F | F | R | AD | V | J | −B | −N | −Z |
| 55 | −G | −U | −AC | −O | −A | M | AA | W | I | −E | −S | −AE | −Q | −C | K | Y |
| 56 | −X | −H | H | X | X | H | −H | −X | −X | −H | H | X | X | H | −H | −X |
| 57 | I | AA | S | A | −Q | −AC | −K | G | Y | U | C | −O | −AE | −M | E | W |
| 58 | V | B | −R | −Z | −F | N | AD | J | −J | −AD | −N | F | Z | R | −B | −V |
| 59 | −K | −AE | −I | M | AC | G | −O | −AA | −E | Q | Y | C | −S | −W | −A | U |
| 60 | −T | D | AB | L | −L | −AB | −D | T | T | −D | −AB | −L | L | AB | D | −T |
| 61 | M | Y | −A | −AA | −K | O | W | −C | −AC | −I | Q | U | −E | −AE | −G | S |
| 62 | R | −J | −Z | B | AD | F | −V | −N | N | V | −F | −AD | −B | Z | J | −R |
| 63 | −O | −S | K | W | −G | −AA | C | AE | A | −AC | −E | Y | I | −U | −M | Q |

Appendix B
Results of Dequant/Descale Instruction

T0 = (S0–S31)
T1 = (S1–S30)
T2 = (S2–S29)
T3 = (S3–S28)
T4 = (S4–S27)
T5 = (S5–S26)
T6 = (S6–S25)
T7 = (S7–S24)
T8 = (S8–S23)
T9 = (S9–S22)
T10 = (S10–S21)
T11 = (S11–S20)
T12 = (S12–S19)
T13 = (S13–S18)
T14 = (S14–S17)
T15 = (S15–S16)
T16 = (S0 + S31) – (S15 + S16)
T17 = (S1 + S30) – (S14 + S17)
T18 = (S2 + S29) – (S13 + S18)
T19 = (S3 + S28) – (S12 + S19)
T20 = (S4 + S27) – (S11 + S20)
T21 = (S5 + S26) – (S10 + S21)
T22 = (S6 + S25) – (S9 + S22)
T23 = (S7 + S24) – (S8 + S23)
T24 = [(S0 + S31) + (S15 + S16)] – [(S7 + S24) + (S8 + S23)]
T25 = [(S1 + S30) + (S14 + S17)] – [(S6 + S25) + (S9 + S22)]
T26 = [(S2 + S29) + (S13 + S18)] – [(S5 + S26) + (S10 + S21)]
T27 = [(S3 + S28) + (S12 + S19)] – [(S4 + S27) + (S11 + S20)]
T28 = [(S0 + S31) + (S15 + S16)] + [(S7 + S24) + (S8 + S23)]
T29 = [(S1 + S30) + (S14 + S17)] + [(S6 + S25) + (S9 + S22)]
T30 = [(S2 + S29) + (S13 + S18)] + [(S5 + S26) + (S10 + S21)]
T31 = [(S3 + S28) + (S12 + S19)] + [(S4 + S27) + (S11 + S20)]

Appendix C
Matrix Equations

V0 = P*T28 – P*T29 – P*T30 + P*T31
V1 = O*T0 – S*T1 – K*T2 + W*T3 + G*T4 – AA*T5 – C*T6 + AE*T7 – A*T8 – AC*T9 + E*T10 + Y*T11 – I*T12 – U*T13 + M*T14 + Q*T15
V2 = N*T16 – V*T17 – F*T18 + AD*T19 – B*T20 – A*T21 + J*T22 + R*T23
V3 = M*T0 – Y*T1 – A*T2 + AA*T3 – K*T4 – O*T5 + W*T6 + C*T7 – AC*T8 + I*T9 + Q*T10 – U*T11 – E*T12 + AE*T13 – G*T14 – s*T15
V4 = L*T24 – AB*T25 + D*T26 + T*T27
V5 = K*T0 – AE*T1 + I*T2 + M*T3 – AC*T4 + G*T5 + O*T6 – AA*T7 + E*T8 + Q*T9 – Y*T10 + C*T11 + S*T12 – W*T13 + A*T14 + U*T15
V6 = J*T16 – AD*T17 + N*T18 + F*T19 – Z*T20 + R*T21 + B*T22 – V*T23
V7 = I*T0 – AA*T1 + S*T2 – A*T3 – Q*T4 + AC*T5 – K*T6 – G*T7 + Y*T8 – U*T9 + C*T10 + O*T11 – AE*T12 + M*T13 – E*T14 – W*T15
V8 = H*T28 – X*T29 + X*T30 – H*T31
V9 = G*T0 – U*T1 + AC*T2 – O*T3 + A*T4 + M*T5 – AA*T6 + W*T7 – I*T8 – E*T9 + S*T10 – AE*T11 + Q*T12 – C*T13 – K*T14 + Y*T15
V10 = F*T16 – R*T17 + AD*T18 – V*T19 + J*T20 + B*T21 – N*T22 + Z*T23
V11 = E*T0 – O*T1 + Y*T2 – AC*T3 + S*T4 – I*T5 – A*T6 + K*T7 – U*T8 + AE*T9 – W*T10 + M*T11 – C*T12 – G*T13 + Q*T14 – AA*T15
V12 = D*T24 – L*T25 + T*T26 – AB*T27
V13 = C*T0 – I*T1 + O*T2 – U*T3 + AA*T4 – AE*T3 + Y*T6 – S*T7 +0 M*T8 – G*T9 + A*T10 + E*T11 – K*T12 + Q*T13 – W*T14 + AC*T15
V14 = B*T16 – F*T17 + J*T18 – N*T19 + R*T20 – V*T21 + Z*T22 – AD*T23
V15 = A*T0 – C*T1 + E*T2 – G*T3 + I*T4 – K*T5 + M*T6 – O*T7 + Q*T8 – S*T9 + UT10 – W*T11 + Y*T12 – AA*T13 + AC*T14 – AE*T15

Appendix C
Matrix Equations

V16 = 0
V17 = –V15
V18 = –V14
V19 = –V13
V20 = –V12
V21 = –V11
V22 = –V10
V23 = –V9
V24 = –V8
V25 = –V7
V26 = –V6
V27 = –V5
V28 = –V4
V29 = –V3
V30 = –V2
V31 = –V1
V32 = –V0
V33 = –Q*T0 + M*T1 + U*T12 – I*T3 – Y*T4 + E*T5 + AC*T6 – A*T7 – AE*T8 – C*T9 + AA*T10 + G*T11 – W*T12 – K*T13 + S*T14 + O*T15
V34 = –R*T16 + J*T17 + Z*T18 – B*T19 – AD*T20 – F*T21 + V*T22 + N*T23
V35 = –S*T0 + G*T1 + AE*T2 + E*T3 – U*T4 – Q*T5 + I*T6 + AC*T7 + C*T8 – W*T9 – O*T10 + K*T11 + AA*T12 + A*T13 – Y*T14 – M*T15
V36 = –T*T24 + D*T25 + AB*T26 + L*T27
V37 = –U*T0 + A*T1 + W*T2 + S*T3 – C*T4 – Y*T5 – Q*T6 + E*T7 + AA*T8 + O*T9 – G*T10 – AC*T11 – M*T12 + I*T13 + AE*T14 + K*T15
V38 = –V*T16 – B*T17 + R*T18 + Z*T19 + F*T20 – N*T21 – AD*T22 – J*T23
V39 = –W*T0 – E*T1 + M*T2 + AE*T3 + O*T4 – C*T5 – U*T6 – Y*T7 – G*T8 + K*T9 + AC*T10 + Q*T11 – A*T12 – S*T13 – AA*T14 – I*T15
V40 = –X*T28 – H*T29 + H*T30 + X*T31
V41 = –Y*T0 – K*T1 + C*T2 + Q*T3 + AE*T4 + S*T5 + E*T6 – I*T7 – W*T8 – AA*T9 – M*T10 + A*T11 + O*T12 + AC*T13 + U*T14 + G*T15
V42 = –Z*T16 – N*T17 – B*T18 + J*T19 + V*T20 + AD*T21 + R*T22 + F*T23
V43 = –AA*T0 – Q*T1 – G*T2 + C*T3 + M*T4 + W*T5 + AE*T6 + U*T7 + K*T8 + A*T9 – I*T10 – S*T11 – AC*T12 – Y*T13 – O*T14 – E*T15
V44 = –AB*T24 – T*T25 – L*T26 – D*T27
V45 = –AC*T0 – W*T1 – Q*T2 – KIT3 – E*T4 + A*T5 + G*T6 + M*T7 + S*T8 + Y*T9 + AE*T10 + AA*T11 + U*T12 + O*T13 + I*T14 + C*T15
V46 = –AD*T16 – Z*T17 – V*T18 – R*T19 – N*T20 – J*T21 – F*T22 – B*T23
V47 = –AE*T0 – AC*T1 – AA*T2 – Y*T3 – W*T4 – U*T5 – S*T6 – Q*T7 – O*T8 – M*T9 – K*T10 – I*T11 – G*T12 – E*T13 – C*T14 – A*T15
V48 = –1*T28 – 1*T29 – 1*T30 – 1* T31
V49 = V47
V50 = V46
V51 = V45
V52 = V44
V53 = V43
V54 = V42
V55 = V41
V56 = V40
V57 = V39
V58 = V38
V59 = V37
V60 = V36
V61 = V35
V62 = V34
V63 = V33

V17 through 48 are stored in PMEM in reverse order.

Table D.1 contains a C code listing of a program that executes dequantizing, descaling, matrixing, and windowing steps as described above.

TABLE D.1

```
/* Audio Section of CL480 Signal Processing Unit */
/* Written by Dave Galbi */
#include "gobal.h"
#include "spurom.h"
#include "command.h"
spua(cmd,pbank) {/* cmd=command being executed, pbank=pmem bank being used by SPU */
int i,k;              /* loop counters for subband */
int zdata;            /* subband samples read from zmem */
int bitalloc,scf;     /* bit allocation and scale factor indices */
int dequant;          /* dequantized subband sample */
int descale;          /* subband sample descaled by 2^(-1/3) or 2^(-2/3) */
int sb[32];           /* fully descaled subband samples */
int u;                /* unpacked input for windowing (called u[i] in MPEG spec) */
int paddr;            /* address of pmem location with MSBs of u[i] */
int waddr1,waddr2;    /* address of window coefficients */
int a,b,c,d;          /* matrixing results */
static int zvec=0;    /* indicates which of 6 vectors in zmem is being processed */
static int mindex=0;  /* indicates which of 8 WINDOW_MATRIX sections is being processed */
/* compute x*y where x is s1.20, y is s1.18 and the result is s1.20 */
#define mul(x,y)floor((double)x*(double)y/0x40000+.5)
#define clamp22(x)CLAMP(x,0x1FFFFF, -0x200000) /* clamp is s1.20 */
#define bfly_and_clamp(sum,diff,x,y) {diff=clamp22(x-y);sum = clamp22(x+y);}
if(cmd==DEQUANT_DESCALE) {
    for(i=0; i<32;i++) {
        zdata = zmem[JOIN3(zvec,2,1,i,4,0,zvec,0,0)] << 3;/* zmem is s.15,zdata is s.18 */
        /* LSB of zvec selects between left channel (0) and right channel (1) */
        bitalloc = BIT(zvec,0) ? BITS(qmem[i+32],15,8) : BITS(qmem[i+32],7,0);
        dequant = mul(coeffc[bitalloc], (zdata + coeffd[bitalloc]));
        scf = BIT(zvec,0) ? BITS(qmem[i],15,8) : BITS(qmem[i],7,0);
        scf = BIT(scf,7) ? 0 : BIT(scf,6) ? 63 : scf; /* clamp scf to [63,0] */
        descale = mul(dequant, nint(pow(2., -(scf%3)/3.)*0x40000));
        sb[i] = mul(descale, nint(pow(2., 1.-scf/3 )*0x40000));
    }
    zvec = (zvec+1)%6;
    for(i=0; i<16; i++) bfly_and_clamp(sb[31-i],tmem[i], sb[i],sb[31-i]);
    for(i=16; i<24; i++) bfly_and_clamp(sb[47-i],tmem[i], sb[47-i],sb[i]);
    for(i=24; i<28; i++) bfly_and_clamp(tmem[4+i],tmem[i], sb[55-i],sb[i]);
}
/* compute a + x*y where a and x are s1.20, y is s1.18 and the results is s1.20 */
#define mac_and_clamp(a,x,y)clamp22(a+(int)floor((double)x*(double)y/0x40000+.5))
#define N(i,k) nint(cos((16+i)*(2*k+1)*M_PI/64)*0x40000)/* s1.18 matrix coefficients */
if(cmd==WINDOW_MATRIX) {
    /* Perform 1/8 of windowing for a vector:tmem = tmem + pmem*coeffw */
    waddr1 = 64*(7-mindex) + 32;
    waddr2 = 64*(7-mindex) + 63;
    for(i=0; i<33; i++) {
        if(mindex==0 & i<17)    tmem [32+i]=0; /* reset tmem[32:48] when start new vector */
        if(mindex==0 & i>0 & i<16)tmem[64-i]=0;/* reset tmem[49:63] when start new vector */
        paddr = 2*(i + (i+3)/4) + pbank*128;
        switch (i%4) {/* unpacked s.19 from pmem and multiply by 2 to get s.20 format */
            case 0; u = 2*(JOIN3(pmem[paddr],7,4,pmem[paddr+2],7,0,pmem[paddr+3],7,0)); break;
            case 1; u = 2*(JOIN3(pmem[paddr],7,0,pmem[paddr+1],7,0,pmem[paddr+3],3,0)); break;
            case 2; u = 2*(JOIN3(pmem[paddr],7,0,pmem[paddr+1],7,4,pmem[paddr+3],7,0)); break;
            case 3; u = 2*(JOIN3(pmem[paddr],7,0,pmem[paddr+2],3,0,pmem[paddr+3],7,0)); break;
        }
        u -= BIT(u,20) ? 0x200000 : 0;/* extend sign of data read from pmem */
        if(i<32) {
            tmem[32+i] = mac_and_clamp(tmem[32+i],u,coeffw[waddr1++]);
            if(i==16)waddr1 -= 32;
        }
        if(i>0 & i!=16) {
            tmem[64-i] = mac_and clamp(tmem[64-i],u*(i>15?-1:1),coeffw[waddr2--]);
            if(i==15)waddr2 -= 33;
        }
    }
    if(mindex==7)/* convert decoded samples to s.15 at end of last windowing step */
        for(i=32; i<64;i++) {
            if(tmem[i]<0) tmem[i] += 31; /* round toward zero because of conformance test */
            tmem[i] = BITS( CLAMP(tmem[i],0xFFFFF,-0x100000),20,5);
        }
    /* Perform 1/8 of matrixing for a vector: pmem = SUM( tmem*Nik ) */
    a=b=c=d=0;
    for(k=0; k<16; k++){ a = mac_and _clamp(a, tmem[k], N(17+mindex*4,k));
                         c = mac_and_clamp(c, tmem[k], N(19+mindex*4,k)); }
    for(k=0; k<8; k++) b = mac_and clamp(b, tmem[k+16,], N(18+mindex*4,k));
    for(k=0; k<4; k+ ) d = mac_and clamp(d, tmem[k+24+(mindex%2)*4], N(20+mindex*4,k));
    mindex=(mindex+1)%8;
    /* Clamp matrix results to s.20 */
    a = CLAMP(a, 0xFFFFF, -0x100000);
```

TABLE D.1-continued

```
        b = CLAMP(b, 0xFFFFF, -0x100000);
        c = CLAMP(c, 0xFFFFF, -0x100000);
        d = CLAMP(d, 0xFFFFF, -0x100000);
        /* Pack 4 matrix results into pmem */
        pmem[pbank*128] = BITS(a,20,13);
        pmem[pbank*128+1] = BITS(a,12,5);
        pmem[pbank*128+2] = BITS(b,20,13);
        pmem[pbank*128+3] = JOIN2(b,12,9,a,4,1);
        pmem[pbank*128+4] = BITS(c,20,13);
        pmem[pbank*128+5] = BITS(b,8,1);
        pmem[pbank*128+6] = JOIN2(d,20,17,c,12,9);
        pmem[pbank*128+7] = BITS(c,8,1);
        pmem[pbank*128+8] = BITS(d,16,9);
        pmem[pbank*128+9] = BITS(d,8,1);
        }
}
/* CL480 Signal Processing Unit */
/* Written by Dave Galbi */
#include "global.h"
#include "command.h"
spu() {
int i,j;          /* row and column of coefficient in block */
int addr;         /* address of coefficient in block */
int qac;          /* quantized AC coefficient */
int qaddr,qdata;  /* qmem address and qmem data */
int tmp;          /* temporary variable */
int dmac;         /* results of dmac operation */
double cosine;    /* cosine in floating-point */
int pass;         /* 1 for IDCT from zmem to tmem, 2 for IDCT from tmem to pmem */
int A0,B0,C0,D0,AA0,BB0,CC0,DD0,AAA0,BBB0,CCC0,DDD0; /* intermediate IDCT results */
int A1,B1,C1,D1,AA1,BB1,CC1,DD1,AAA1,BBB1,CCC1,DDD1; /* intermediate IDCT results */
in iA,iB,iC,iAA,BB;   /* intermediate IDCT results from imac operations */
static int cmd=0;     /* command being processed by SPU (0 is idle) */
static int clock=0;   /* number of clocks since last SPU command was start */
static int coded=7;   /* SPU_coded register, indicates which blocks are coded */
static int intra1,intra0;  /* SPU_intra register, intra bit for new or previous macroblock */
static int quant1,quant0;  /* SPU_quant register, quant for new or previous macroblock */
static int iaddr;     /* address for indirect SPU registers */
static int taddr;     /* tmem read/write address */
static int zaddr;     /* zmem read address */
static int zblock=0;  /* block of zmem being processed by IDCT */
static int pblank=0;  /* pmem bank being used by SPU, each bank holds 2 8x8 blocks */
static int oldgsel=511;  /* value of gsel on previous clock */
if(!BIT(gsel,6)) /* read gbus register */
    switch(BITS(gsel,5,0)) {
        case SPU_cmd: gbus_n = JOIN4(cmd!=0,0,0,zero,6,0,iaddr,3,0,cmd,3,0); break;
        case SPU_coded: gbus_n = coded; break;
        case SPU_intra: gbus_n = JOIN2(intra,1,0,0,intra0,0,0); break;
        case SPU_quant: gbus_n = JOIN2(quant,4,0, quant0,4,0); break;
        case SPU_tmem: gbus_n = BITS(tmem[32+taddr++],15,0);/* only non-test mode is */
                taddr &= 32; break;/*supported, which reads addr 32 to 63 */
        case SPU_zaddr: gbus_n = zaddr; break;
        case SPU_zmem: gbus_n = zmem[zdddr++];
                zaddr %= 256; break;
        case SPU_idata:
          switch (iaddr) {
              case SPU_QMEM: gbus_n = qmem[JOIN2(intra0,0,0, zaddr++,4,0)];
                    zaddr %= 256; break;
              case SPU_BANK: gbus_n = pbank; break;
              }
        break;
        }
if(BIT(oldgsel,6))/* write gbus register */
    switch(BITS(oldgsel,5,0)){
        case SPU_cmd: cmd = BITS(gbus,3,0);
                iaddr = BITS(gbus,7,4)<<4;
                pbank ^= !BIT(cmd,0) & cmd<0;/* invert pbank on WINDOW_MATRIX and */
                clock = 0; break;     /* every other IDCT instruction */
        case SPU_coded: coded = JOIN2(coded,2,0,gbus,0,0); break;
        case SPU_intra: intra0 = BIT(gbus,0); break;
        case SPU_quant: quant0 = BITS(gbus,4,0); break;
        case SPU_zaddr: zblock = BITS(gbus,7,6); /* zblock is the address for stage 2 */
                zaddr = BITS(gbus,7,0); break;/* in both hardware and C-model */
        case SPU_tmem: tmem[32+taddr++] = gbus; /* only non-test mode is supported, which */
                taddr %= 32; break;    /* writes addresses 32 to 63 */
        case SPU_idata:
            switch(iaddr) {
                case SPU_QMEM: qmem[JOIN2(intra0,0,0, zaddr++,4,0)]= gbus;
                    zaddr %= 256; break;
```

TABLE D.1-continued

```
                    case SPU_TADDR: taddr = BITS(gbus,5,1);
                        if(!BIT(gbus,0))
                            printf("WARNING: SPU_TADDR[0] should be written with one.\n");
                        break;
                    case SPU_PBANK: pbank = BIT(gbus,0); break;
                }
            break;
    }
oldgsel = gsel;
if(cmd==DEQUANT_DESCALE && clock++==152) {spua(cmd,pbank); cmd=0;}
if(cmd==WINDOW_MATRIX && clock++==127) {spua(cmd,pbank); cmd=0;}
if(cmd>=1 & cmd<=6 && clock++==214) {/* Perform IDCT command */
if(cmd==3) {
    intra1 = intra0;
    quant1 = quant0;}
for(pass=2; pass>0;pass--) {
    for(i=0; i<8;i++) {
        if(pass==1) for (j=0; j<8; j++) {/* Perform dequantization and cosine multiply */
            addr = BIT(cmd,0) ? i*8 + j: j*8 + i;/* do pass 1 on rows when cmd is odd */
            qac = BIT(coded,3) * zmem[addr + zblock*64];
            if(!BIT(intra1,0) & qac<0) qac--;
            /* Upper half of qmem is quantizer for intra, lower half is for non-intra */
                qaddr = JOIN2(intra1,0,0,addr,5,0);
                qdata = BIT(qaddr,0) ? BITS(qmem[qaddr>>1],15,8) : BITS(qmem[qaddr>>1],7,0);
            /* Do not use quantizer scale factor for the DC term of an intra MB */
                tmp =(qaddr==64) ? 8*qdata: quant1*qdata;
            /* Results of dmac instruction should be 2x value of dmac computed below */
                dmac = (tmp * (2*qac + BIT(~intra1 & qac!=0,0)) + (qac<0)*0xf)>>4;
                cosine=cos((i?i:4)*M_PI/16) * cos((j?j:4)*M_PI/16);
            /* Round cosine to 18 fraction bits */
                cosine = floor(cosine*(1<<18) + .5)/(1<<18);
            /* Decrement dmac if it is positive and is not the intra DC */
                if(dmac>0 & qaddr!=64)dmac--;
            /* Replace LSB of dmac */
                tmp = (dmac*~1) + BIT(qaddr!=64 & dmac!=0,0);
            /* Limit range of temp to [2047,-2048] and shift left */
                tmp = CLAMP(tmp,2047,-2048) << 8;
            /* Increment DC term a bit 7 so truncated output of IDCT is rounded */
                tmem[addr] = floor(cosine * tmp + .5) + ((addr==0)?1<<9:0);
        }
#define X(index) tmem[BIT(cmd,0) ? i*8 + index : index*8 + i]
#define bfly(sum,diff, x,y) sum=x+y; diff=x-y;
#define imac(a,b,c,d)cosine = floor(cos(d*m_PI/8)*(1<<19) + .5)/(1<<18);\
                    a = floor(c*cosine + .5) - b;
        bfly(A0,A1, X(1),X(7));
        bfly(B0,B1, X(3),X(5));
        bfly(C0,C1, X(2),X(6));
        bfly(D0,D1, X(0),X(4));
        imac(iA, A0,A1,1);
        imac(iB, B0,B1,3);
        imac(iC, C0,C1,2);
        bfly(AA0,AA1, A0,B0);
        bfly(BB0,BB1, iA,iB);
        bfly(CC0,CC1, D1,iC);
        bfly(DD0,DD1, D0,C0);
        imac(iAA, BB0,AA1,2);
        imac(iBB, AA0,BB1,2);
        bfly(X(0),X(7), DD0,AA0);
        bfly(X(1),X(6), CC0,BB0);
        bfly(X(2),X(5), CC1,iAA);
        bfly(X(3),X(4), DD1,iBB);
        }
    if(pass==2)
        for(i=0; i<64; i++) {/* copy tmem to pmem */
            /* chroma blocks (cmd=2 or 3) are interleaved in pmem, luma blocks are not */
            /* for luma, cmd[0] determines which of the 2 blocks in a bank is written */
            addr = (cmd!=2 & cmd!=3) ? ((i&7) | ((i<<1) & 0xf0) | ((i>>4) & 8)) + 8*(cmd&1):
                ((cmd==2) ? 2*i : 2*i + 1);
            /* intra blocks are clamped to [255,0], non-intra are clamped to [255,-256] */
            pmem[addr + pbank*128] = CLAMP(tmem[i]>>10,255,intra1?0:-256);
        }
    }
if(BIT(coded,3))
        zblock = (zblock+1)%3;
    coded = JOIN2(coded,2,0, coded,0,0);
    cmd=0;
    }
}
```

I claim:

1. A method for generating sound from data following an MPEG encoding standard comprising:

transferring a block consisting of independent components of time-domain vectors to a first memory, wherein transferring the block comprises transferring a total of 17 components from a first time-domain vector and 16 components from a second time-domain vector;

determining products of the independent components in the block with corresponding windowing coefficients;

accumulating the products in a plurality of sums, each sum corresponding to a different sound amplitude value; and generating a sound from the sound amplitude values.

2. The method of claim 1, wherein:

the step of determining products comprises performing 64 multiplications, each multiplication involving one of the components from the block and a windowing coefficient; and the step of accumulating comprises adding a pair of the products to each of 32 sums.

3. The method of claim 2, further comprising:

multiplying each of a series of matrixing coefficients by a corresponding combination of components of a frequency-domain vector;

accumulating the products to generate four components of a time-domain vector; and writing the four components of the time-domain vector to a second memory, wherein transferring the block is from the second memory to the first memory.

4. The method of claim 3, further comprising repeating the steps of claims 1, 2, and 3 eight times wherein no two steps of transferring a block transfers components from the same pair of time-domain vectors.

* * * * *